US012772909B2

(12) United States Patent
He

(10) Patent No.: US 12,772,909 B2
(45) Date of Patent: Oct. 20, 2026

(54) CHIP PACKAGING METHOD, CHIP PACKAGING MODULE, AND EMBEDDED SUBSTRATE CHIP PACKAGING STRUCTURE

(71) Applicant: FOREHOPE SEMICONDUCTOR (NINGBO) CO., LTD., Ningbo City (CN)

(72) Inventor: Zhenghong He, Ningbo City (CN)

(73) Assignee: FOREHOPE SEMICONDUCTOR (NINGBO) CO., LTD., Ningbo City (CN)

( * ) Notice: Subject to any disclaimer, the term of this patent is extended or adjusted under 35 U.S.C. 154(b) by 381 days.

(21) Appl. No.: 18/510,404

(22) Filed: Nov. 15, 2023

(65) Prior Publication Data

US 2024/0413138 A1 Dec. 12, 2024

(30) Foreign Application Priority Data

Jun. 12, 2023 (CN) ......................... 202310685756.3

(51) Int. Cl.
*H10W 90/00* (2026.01)
*H10W 40/10* (2026.01)
(Continued)

(52) U.S. Cl.
CPC ........... *H10W 90/00* (2026.01); *H10W 40/10* (2026.01); *H10W 42/00* (2026.01);
(Continued)

(58) Field of Classification Search
CPC ..... H10W 40/10; H10W 42/00; H10W 42/20; H10W 70/09; H10W 70/60;
(Continued)

(56) References Cited

U.S. PATENT DOCUMENTS 9,064,936 B2 * 6/2015 Lin ......................... H10P 72/74
9,659,806 B2 * 5/2017 Chang ..................... H10P 72/74
(Continued)

FOREIGN PATENT DOCUMENTS

CN 111834326 A 10/2020
CN 114038843 A 2/2022
(Continued)

OTHER PUBLICATIONS

Search Report issued in related Chinese Application No. 2023106857563, by the State Intellectual Property Office, in 8 pages.

(Continued)

*Primary Examiner* — Leonard Chang
*Assistant Examiner* — Nimarta Kaur Chowdhary
(74) *Attorney, Agent, or Firm* — Davis Wright Tremaine LLP

(57) ABSTRACT

A chip packaging method, a chip packaging module, and an embedded substrate chip packaging structure are provided. Firstly, a carrier is used to form a first encapsulant on the carrier, a first conductive pillar is formed in the first encapsulant, and a bump is formed at the top of the first conductive pillar, then the bump is etched through a micro-etching process, so that a stop ring can be formed between the bump
(Continued)

and the first conductive pillar after the bump is partially etched, and then a first chip is mounted in the mounting groove, and the first chip has a flip-chip structure.

11 Claims, 16 Drawing Sheets

(51) Int. Cl.

| | |
|---|---|
| ***H10W 42/00*** | (2026.01) |
| ***H10W 70/60*** | (2026.01) |
| ***H10W 70/685*** | (2026.01) |
| ***H10W 74/01*** | (2026.01) |
| ***H10W 74/10*** | (2026.01) |

(52) U.S. Cl.
CPC ........ *H10W 70/611* (2026.01); *H10W 70/685* (2026.01); *H10W 74/019* (2026.01); *H10W 74/117* (2026.01); *H10W 90/401* (2026.01); *H10W 90/724* (2026.01); *H10W 90/734* (2026.01)

(58) Field of Classification Search
CPC ............. H10W 70/611; H10W 70/614; H10W 70/685; H10W 74/019; H10W 74/117; H10W 90/00; H10W 90/401; H10W 90/701; H10W 90/724; H10W 90/734
See application file for complete search history.

(56) References Cited

U.S. PATENT DOCUMENTS

| | | | | |
|---|---|---|---|---|
| 2011/0155433 A1* | 6/2011 | Funaya | H05K 1/115 | 174/258 |
| 2015/0179591 A1* | 6/2015 | Tsai | H10W 42/121 | 438/666 |
| 2017/0317058 A1* | 11/2017 | Chen | H10W 90/00 | |
| 2020/0273804 A1* | 8/2020 | Jeon | H10P 72/74 | |
| 2026/0082981 A1* | 3/2026 | Chen | H10P 72/74 | |

FOREIGN PATENT DOCUMENTS

| | | |
|---|---|---|
| CN | 115547961 A | 12/2022 |
| CN | 115881705 A | 3/2023 |

OTHER PUBLICATIONS

Notification to Grant Patent Right for Invention of priority issued in related application No. 2023106857563, by the State Intellectual Property Office, on Jul. 21, 2023, in 2 pages.

* cited by examiner

CHIP PACKAGING METHOD, CHIP PACKAGING MODULE, AND EMBEDDED SUBSTRATE CHIP PACKAGING STRUCTURE

CROSS-REFERENCE TO RELATED APPLICATION

The present disclosure claims the priority to the Chinese patent application with the filing No. 2023106857563 filed with the Chinese Patent Office on Jun. 12, 2023, and entitled "Chip Packaging Method, Chip packaging Module, and Embedded Substrate Chip packaging Structure", the contents of which are incorporated herein by reference in entirety.

TECHNICAL FIELD

The present disclosure relates to the technical field of chip packaging, in particular to a chip packaging method, a chip packaging module, and an embedded substrate chip packaging structure.

BACKGROUND ART

With the rapid development of semiconductor industry, a chiplet technology is developed, which adopts a new design method to package small chips with different functions together. A package scheme for multiple small chips in the existing 2.5D packaging technology is to package the chips onto a transfer board, wherein a columnar metal pillar is used for grinding and flattening, which is easy to cause excessive grinding depth, and thus excessive grinding, and it is impossible to control the grinding process parameters of the metal pillar, resulting in damage to the chip pad.

SUMMARY

The present disclosure provides a chip packaging method, a chip packaging module, and an embedded substrate chip packaging structure, which can determine grinding parameters according to its own structure, so that excessive grinding is avoided during grinding, chip safety is protected, and device reliability is improved.

Embodiments of the present disclosure can be implemented as follows.

In an embodiment, the present disclosure provides a chip packaging method, including:

- providing a carrier;
- arranging a first encapsulant and a first chip on the carrier, wherein the first encapsulant is located around the first chip, a first conductive pillar is arranged in the first encapsulant, one end of the first conductive pillar penetrates to the carrier, the other end is provided with a bump protruding relative to the first encapsulant, and a second conductive pillar is arranged on one side of the first chip away from the carrier;
- etching the bump to form a stop ring between the first conductive pillar and the bump;
- performing plastic packaging or film covering on the first encapsulant to form a protective layer, wherein the protective layer wraps the bump and the first chip;
- performing grinding on the protective layer with the stop ring as a grinding stop layer, so as to expose the stop ring and the second conductive pillar;
- arranging a second chip on one side of the protective layer away from the carrier, wherein the second chip is electrically connected with both the first conductive pillar and the second conductive pillar;
- removing the carrier, and exposing the first encapsulant;
- Forming a base wiring combination layer on the first encapsulant;
- performing ball planting on the base wiring combination layer to form solder balls, and cutting.

In an embodiment, the present disclosure provides a chip packaging module, which is prepared by using the chip packaging method described in any one of the aforementioned embodiments. The chip packaging module includes:

- a base wiring combination layer, wherein one side of the base wiring combination layer is provided with solder balls;
  - The first encapsulant is arranged on the other side of the base wiring combination layer, and is provided with a mounting groove;
- a first conductive pillar, arranged in the first encapsulant, wherein both ends of the first conductive pillar penetrate to both side surfaces of the first encapsulant;
- a first chip, arranged in the first encapsulant, wherein one side of the first chip away from the base wiring combination layer is provided with a second conductive pillar;
- A protective layer that wraps the first chip and the second conductive pillar is exposed to the protective layer;
- a second chip, arranged on one side of the protective layer away from the base wiring combination layer, and electrically connected with the second conductive pillar and the first conductive pillar.

In an embodiment, the present disclosure provides an embedded substrate chip packaging structure, which includes a substrate and the chip packaging module according to any one of the aforementioned embodiments, wherein a circuit layer is arranged in the substrate, a module groove is arranged on one side of the substrate, and the chip packaging module is mounted in the module groove, and is electrically connected with the circuit layer.

BRIEF DESCRIPTION OF DRAWINGS

In order to illustrate the embodiments of the present disclosure more clearly, the accompanying drawing which needs to be used in the description of the embodiments will be briefly introduced below. It is to be understood that the accompanying drawings only show some embodiments of the present disclosure, so they shall not be regarded as limiting the scope. For those ordinarily skilled in the art, other relevant drawings may be obtained in light of the accompanying drawings without any creative effort.

Figure 1:
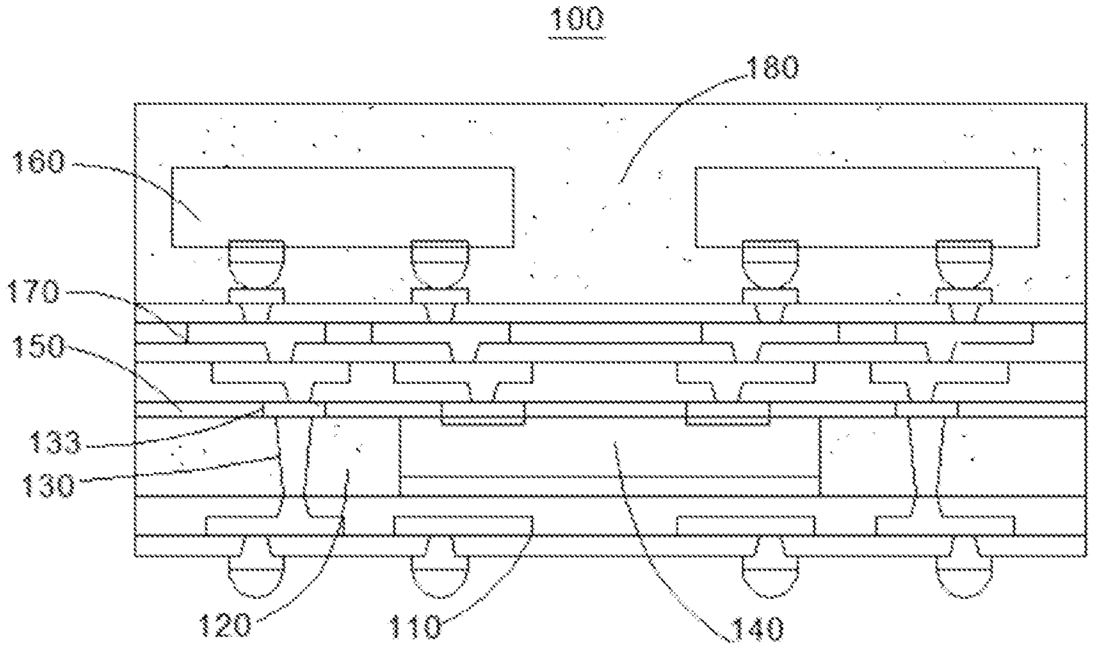
FIG. 1 is a structural schematic diagram of a chip packaging module provided by a first embodiment of the present disclosure.

Reference numerals: 100—chip packaging module; 110—base wiring combination layer; 111—transfer pad; 113—ground point; 120—first encapsulant; 121—mounting groove; 123—metal conductive layer; 125—metal heat dissipation layer; 127—heat dissipation groove; 129—heat dissipation metal pillar; 130—first conductive pillar; 131—bump; 133—stop ring; 140—first chip; 141—second conductive pillar; 143—adhesive film layer; 150—protective layer; 160—second chip; 170—transfer wiring combination layer; 180—second encapsulant; 200—embedded substrate chip packaging structure; 210—substrate; 211—module groove; 213—substrate pad; 215—passive device; 217—limiting step; 230—fixing adhesive layer; 240—third encapsulant; 250—third chip; 270—fourth chip; 290—connecting wire arc; 300—carrier.

DETAILED DESCRIPTION OF EMBODIMENTS

In order to make the objectives, examples and advantages of the embodiments of the present disclosure clearer, the embodiments of the present disclosure will be clearly and completely described below with reference to the accompanying drawings in the embodiments of the present disclosure. Obviously, the described embodiments are some rather than all of the embodiments of the present disclosure. Generally, the components of the embodiments of the present disclosure described and illustrated in the drawings herein may be arranged and designed in various different configurations.

Therefore, the following detailed description of the embodiments of the present disclosure provided in the drawings is not intended to limit the claimed scope of protection of the present disclosure, but only represents selected embodiments of the present disclosure. Based on the embodiments of the present disclosure, all other embodiment obtained by a person ordinarily skilled in the art without making creative efforts shall fall within the scope of protection of the present disclosure.

It should be noted that similar reference numerals and letters indicate similar items in the accompanying drawings, so once a certain item is defined in one drawing, it does not need to be further defined and described in subsequent drawings.

The terms used in the present disclosure are intended only to describe specific examples and are not intended to limit the present disclosure. The singular forms “a”, “an” and “the” used in the present disclosure are also intended to include plural forms, unless otherwise clearly expressed in context. It should also be understood that the term “and/or” used in the present disclosure refers to any or all possible combinations including one or more related listed items.

In the description of the present disclosure, it should be noted that the orientation or positional relationship indicated by the terms “upper”, “lower”, “inner” and “outer”, etc. is based on the orientation or positional relationship shown in the accompanying drawings, or the orientation or positional relationship that the product is generally placed when it is used, and it is only for convenience of describing the present disclosure and simplifying the description, rather than indicating or implying that the referred apparatus or element must have a specific orientation, or be constructed and operated in a specific orientation, so it should not be understood as a limitation on the present disclosure.

In addition, the terms “first” and “second”, etc. are only intended for distinguishing descriptions, and cannot be understood as indicating or implying relative importance.

In the prior art, a columnar metal pillar is used for grinding platforming, and the grinding depth is too deep to control the grinding process parameters of the metal pillar, leading to damage to the chip pad. In addition, for the metal pillar on the chip, the grinding process mainly uses a chemical agent and grinding disc particles to relatively rotate the surface of the wafer to achieve planarization. The chip pad columnar metal structure used in the grinding process is easily subjected to shearing force, which causes cracks at the bottom of the metal pillar and the chip pad, thus leading to electrical failure and other problems.

In addition, the molding compound used in the existing structure to protect the chip is usually a one-time plastic package structure. After the plastic packaging is completed, the molding compound is warped, and is easily subjected to shearing force during grinding, which causes cracks on the surface of the molding compound and affects its structural strength.

In order to solve the above problems, embodiments of the present disclosure provides a new chip packaging method, a chip packaging module, and an embedded substrate chip packaging structure. It should be noted that the features in the embodiments of the present disclosure may be combined with each other if not conflicted.

First Embodiment

Referring to FIG. 1, this embodiment provides a chip packaging method for preparing a chip packaging module 100, wherein the grinding parameters can be determined according to its own structure, and excessive grinding can be avoided during grinding, so that chip security is protected, and device reliability can be improved. The specific structure of the chip packaging module 100 can be referred to the following description, and the chip packaging method includes the following steps S1 to S11.

S1: providing a carrier 300.

Figure 2:
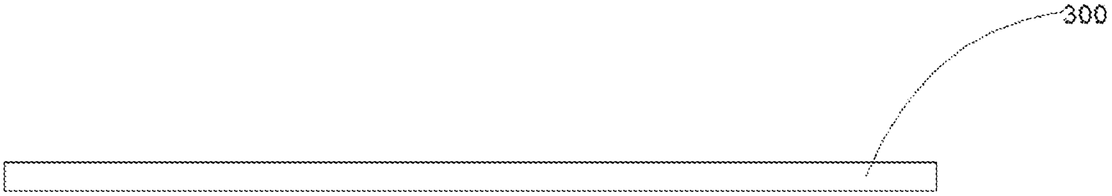
FIGS. 2 to 14 are process flow diagrams of a chip packaging method provided by the first embodiment of the present disclosure.

Referring to FIG. 2, specifically, a substrate 210 or a carrier 300, such as the carrier 300, is taken, and the carrier 300 can be made of glass, silicon oxide, metal and other materials.

S2: mounting a first chip 140 on the carrier 300.

Figure 3:
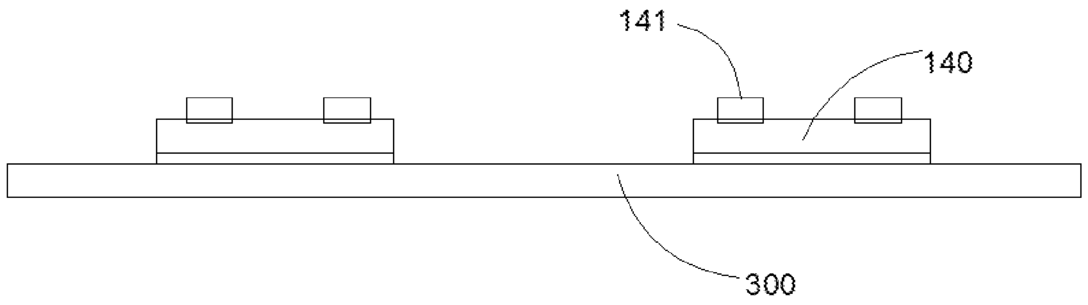

Specifically, referring to FIG. 3, a liquid adhesive layer (which can be a UV adhesive layer) can be coated using a coating machine by spin coating, then it is soft baked by a hot plate and shaped into a film, and then the back surface of the first chip 140 can be mounted on the carrier 300 through an adhesive film layer by means of a surface-mounting process.

S3: forming a first encapsulant 120 on the carrier 300, wherein the first encapsulant 120 wraps the first chip 140.

Figure 4:
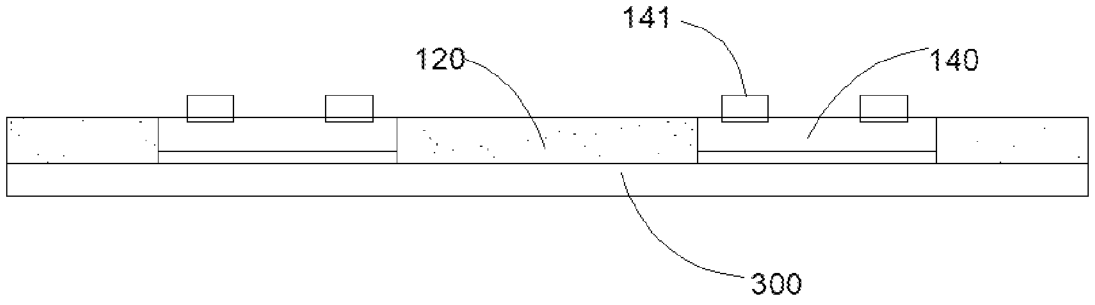

Specifically, referring to FIG. 4, a liquid plastic packaging process can be adopted, and the first encapsulant 120 is formed by printing a liquid molding compound and baking, wherein the first encapsulant 120 can wraps the first chip 140.

S4: forming a first conductive pillar 130 in the first encapsulant 120, wherein one end of the first conductive pillar 130 penetrates to the carrier 300, and the other end of the first conductive pillar 130 is provided with a bump 131 protruding relative to the first encapsulant 120.

Figure 5:
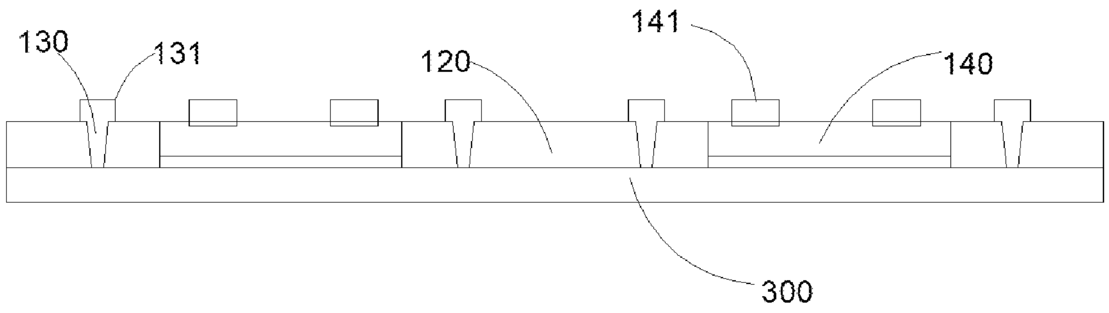

Specifically, referring to FIG. 5, an obconical opening can be firstly formed by laser grooving or etching on the first encapsulant 120, then organic pollutants or impurities can be removed by cleaning process, and water and moisture can be removed by baking again, and then a metal pillar is formed in the opening by an electroplating process. The metal pillar needs to be higher than the first encapsulant 120, that is, the metal pillar is the first conductive pillar 130 with the bump 131, wherein the overall height of the bump 131 can be H1.

S5: etching the bump 131 to form a stop ring 133 between the first conductive pillar 130 and the bump 131.

Figure 6:
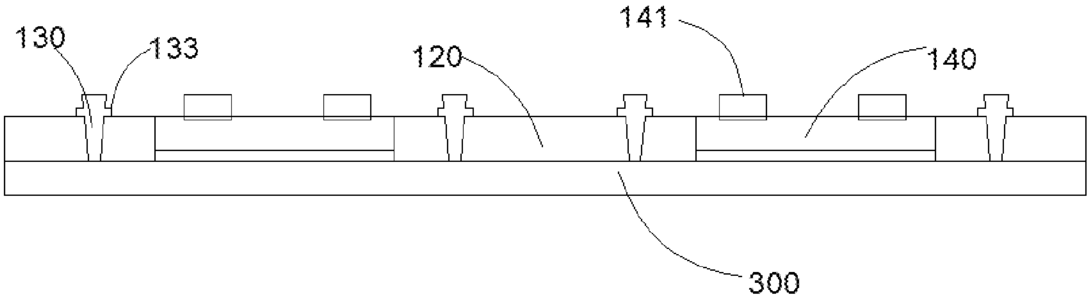

Referring to FIG. 6 in combination, specifically, the bump 131 is micro-etched by using a plasma etching technology or a chemical etching technology, wherein the bump 131 is micro-etched by using etchant, and the edge of the bump 131 is etched away to form a conical structure. At the same time, a stop ring 133 is formed on the surface of the first encapsulant 120, the height of the stop ring 133 can be H2, and the height of the remaining bump 131 can be H3, where H3+H2=H1.

S6: forming a protective layer 150 by performing plastic packaging or film covering on the first encapsulant 120, wherein the protective layer 150 wraps the bump 131 and the first chip 140.

Figure 7:
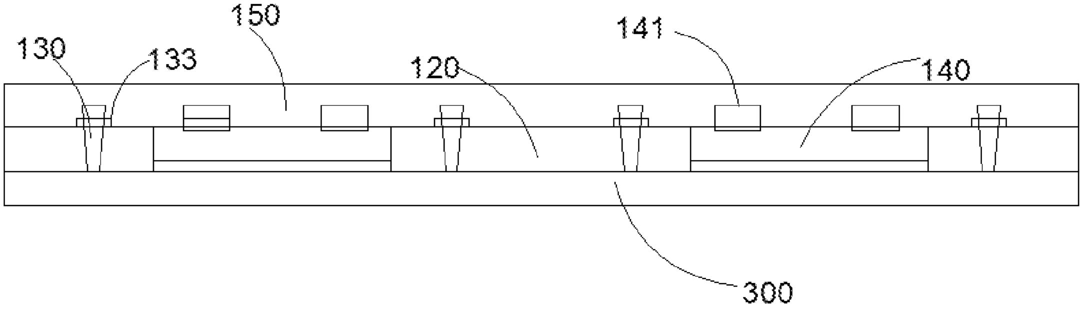

Specifically, referring to FIG. 7, in this embodiment, a protective layer 150 can be formed by film covering, wherein the protective layer 150 can be a dielectric material, and the protective layer 150 can completely wrap the bump 131 and the first chip 140, thus functioning as buffering and protecting. At the same time, the protective layer 150 can wrap the second conductive pillar 141, which is convenient for subsequent grinding.

S7: grinding the protective layer 150 with the stop ring 133 as a grinding stop layer, so as to expose the stop ring 133 and the second conductive pillar 141.

Figure 8:
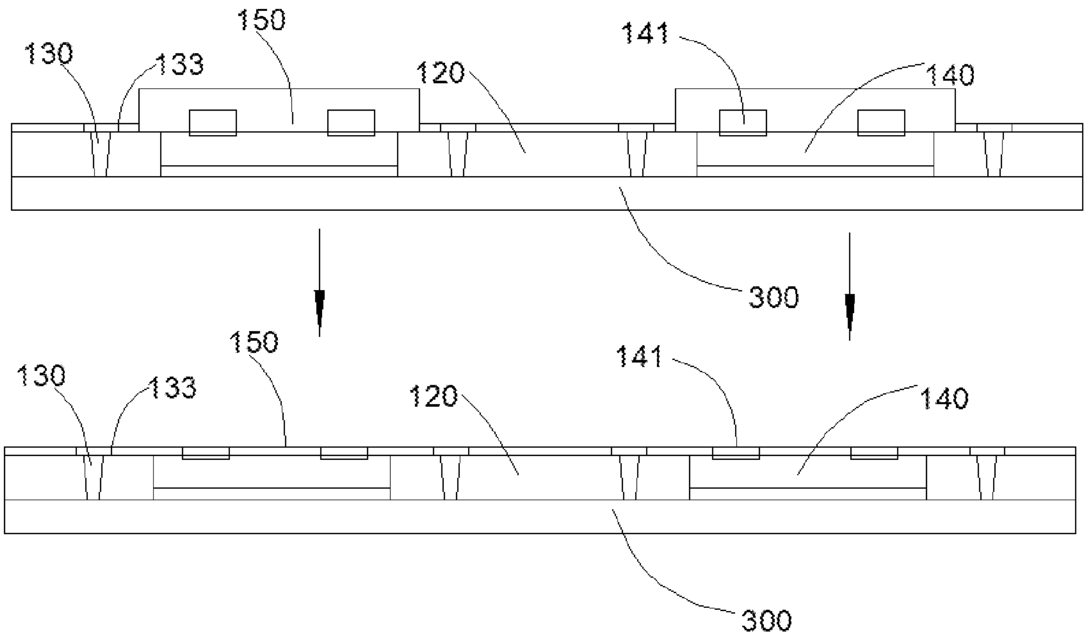

Specifically, referring to FIG. 8 in combination, multiple grinding processes can be adopted. Firstly, a first grinding is performed on the first partition of the protective layer 150 with the stop ring 133 as the grinding stop layer. Then, a second grinding is performed on the second partition of the protective layer 150. Herein, the bump 131 is located in the first partition, and the second conductive pillar 141 is located in the second partition. The grinding height of the first grinding is the same as the grinding height of the second grinding.

In the actual first grinding, a diamond grinding knife can be used to grind the first partition where the bump 131 is located, and the grinding height can be up to the position of the stop ring 133, for example, the grinding height can be H3, so that the grinding parameters can be obtained. Then, the second grinding is performed to grind the remaining protective layer 150. The parameters of the first grinding and the second grinding are the same, wherein the grinding mesh number can be 2000 # to 4000 #, the grinding speed can be 1000 r/m to 6000 r/m, and the grinding height is H3, so that the protective layer 150 with the height of H2 remains, and the stop ring 133 and the second conductive pillar 141 are exposed.

It should be noted that the stop ring 133 is additionally arranged in this embodiment, so the stop ring 133 can be used as the grinding stop layer in the grinding process. Specifically, in the grinding process, whether the stop layer is reached can be determined by the sudden change of the cross-sectional shape of the metal pillar, for example, when the cross-sectional shape at the stop ring 133 is suddenly changed, that is, the stop can be determined, so that the grinding parameters can be determined, and excessive grinding in the grinding process can be avoided. In addition, adopting the second grinding process can reduce the grinding resistance, so that the hidden crack at the bottom of the second conductive pillar 141 on the chip can be suppressed, and the grinding is more accurate and reliable. Moreover, the parameters determined in the first grinding can be used in the second grinding, so as to further avoid excessive grinding of the second conductive pillar 141 on the chip, ensuring the chip safety and improving the reliability of the device.

S8: arranging a second chip 160 on the side of the protective layer 150 away from the carrier 300, wherein the second chip 160 is electrically connected with both the first conductive pillar 130 and the second conductive pillar 141.

Figure 9:
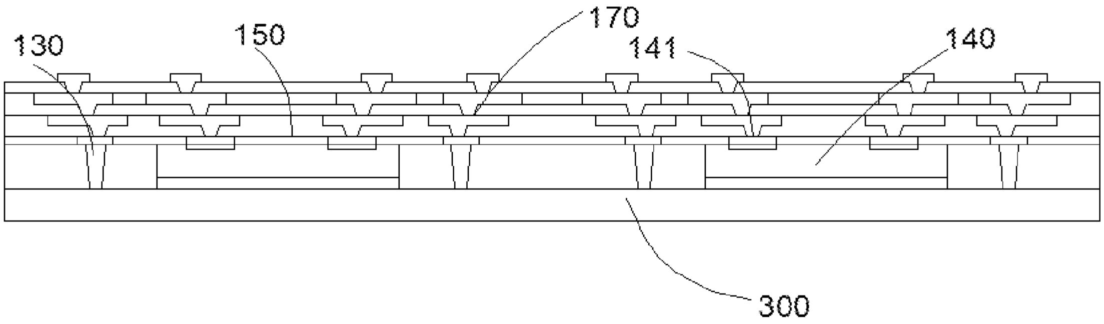
Figure 10:
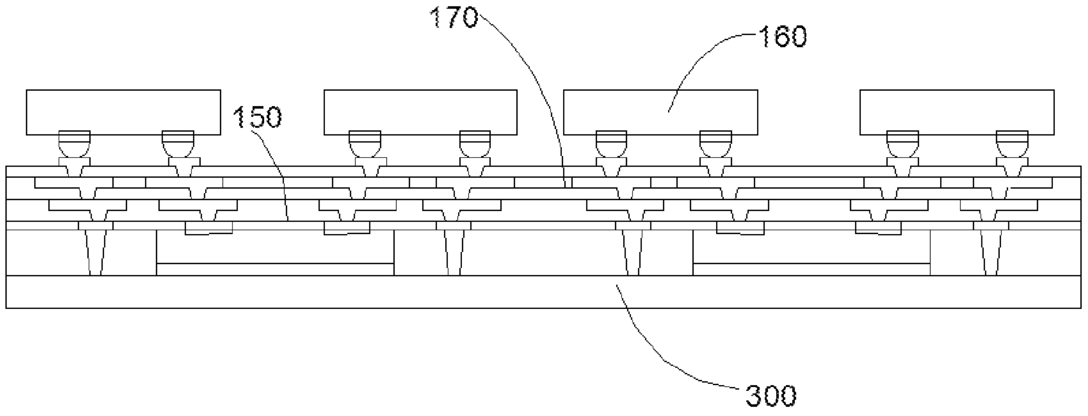

Specifically, referring to FIGS. 9 and 10, after completing grinding, a transfer wiring combination layer 170 may be formed on the side of the protective layer 150 away from the carrier 300; then, the second chip 160 is mounted on the transfer wiring combination layer 170.

After the grinding process is actually completed, a dielectric layer and a metal layer can be formed on the surface of the protective layer 150 at one time by using the spin coating process again, so as to complete the wiring, thereby forming the transfer wiring combination layer 170. For specific wiring process, please refer to the existing wiring structure and process.

After completing the transfer wiring combination layer 170, a plurality of second chips 160 can be surface-mounted on the surface of the transfer wiring combination layer 170, thus completing the integrated arrangement of the plurality of chips. Herein, the second chip 160 can be a flip chip, and the second chip 160 is soldered on the transfer wiring combination layer 170 by reflow soldering.

Figure 11:
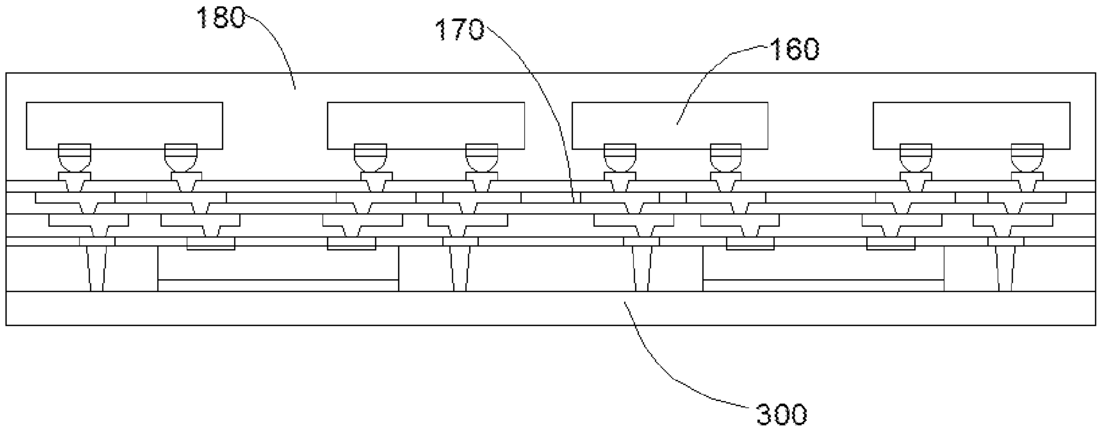

Referring to FIG. 11 in combination, after the second chip 160 is mounted, the soldering structure of the flipped second chip 160 can be protected by using the plastic packaging process again, and a second encapsulant 180 can be formed outside the second chip 160.

S9: removing the carrier 300 and exposing the first encapsulant 120.

Figure 12:
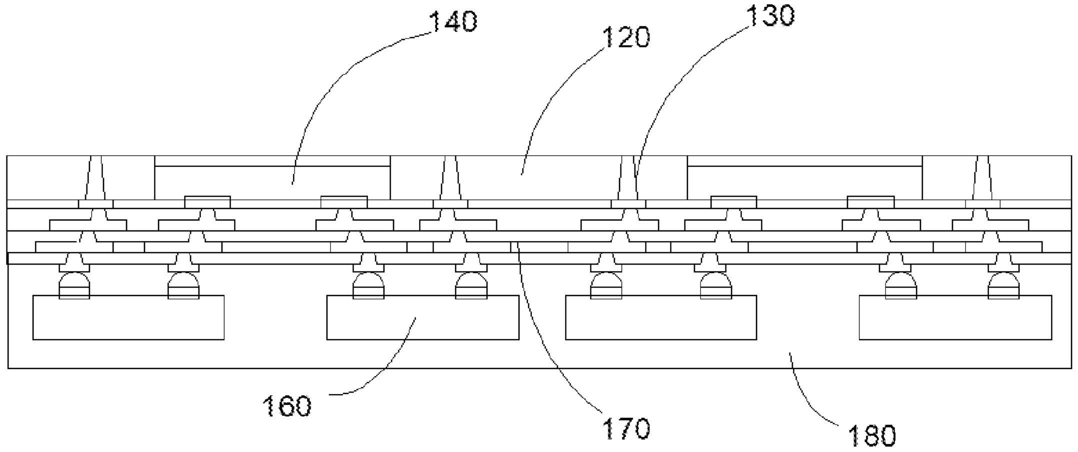

Specifically, referring to FIG. 12 in combination, the adhesive layer can be peeled off by irradiating UV on the back of the carrier 300, thereby removing the carrier 300 and exposing the surface of the first encapsulant 120.

S10: forming a base wiring combination layer 110 on the first encapsulant 120.

Figure 13:
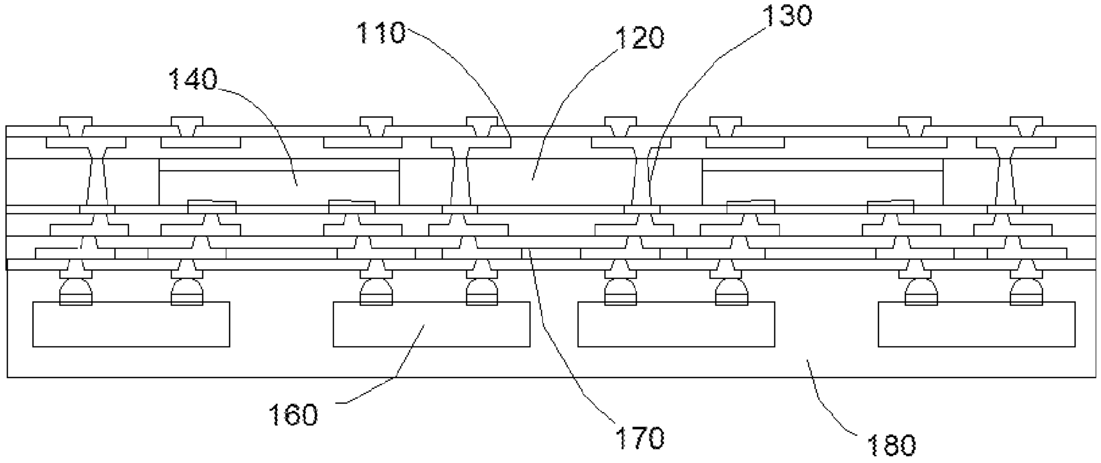

Specifically, referring to FIG. 13 in combination, the base wiring combination layer 110 can be prepared by the same process as the transfer wiring combination layer 170, and the base wiring combination layer 110 is electrically connected with the first conductive pillar 130, thereby implementing the upper and lower electrical connection.

S11: performing ball planting on the base wiring combination layer 110 to form solder balls, and perform cutting.

Figure 14:
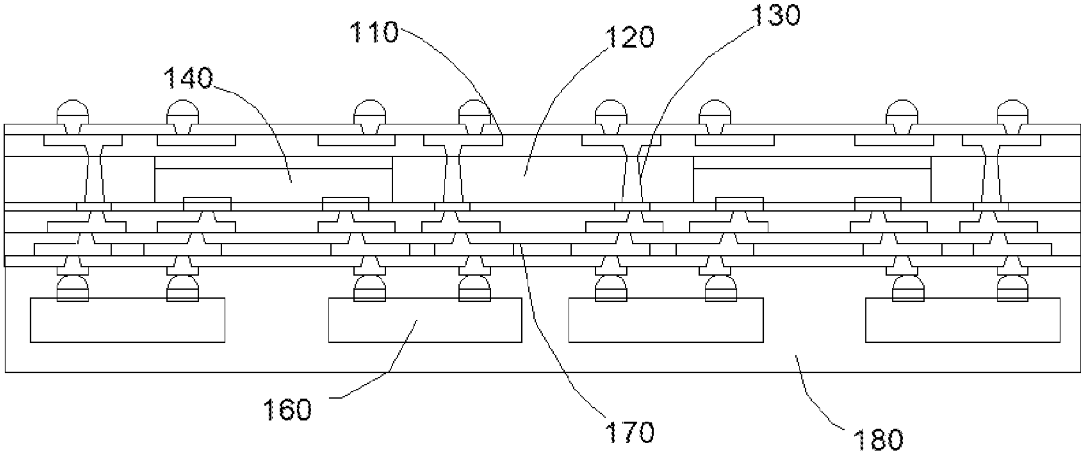

Specifically, referring to FIGS. 14 and 1, after forming the base wiring combination layer 110, a ball planting process can be performed on the copper pillar bumps of the base wiring combination layer 110, and the solder balls can be made of SnAg, SnAgCu, etc., and then a cutting process can be performed again to form a single product.

This embodiment further provides a chip packaging module 100, which can be prepared by the aforementioned chip packaging method. The chip packaging module 100 includes a base wiring combination layer 110, a first encapsulant 120, a first conductive pillar 130, a first chip 140, a protective layer 150, a second chip 160, a transfer wiring combination layer 170 and a second encapsulant 180, wherein one side of the base wiring combination layer 110 is provided with solder balls, and the first encapsulant 120 is arranged on the other side of the base wiring combination layer 110 and is formed with a mounting groove 121. The first conductive pillar 130 is arranged in the first encapsulant 120, and both ends of the first conductive pillar 130 penetrate to both side surfaces of the first encapsulant 120. The first chip 140 is mounted in the mounting groove 121, and the side of the first chip 140 away from the base wiring combination layer 110 is provided with a second conductive pillar 141. The protective layer 150 is at least arranged in the mounting groove 121 and wraps the first chip 140, and the second conductive pillar 141 is exposed to the protective layer 150. The second chip 160 is arranged on the side of the protective layer 150 away from the base wiring combination layer 110, and is electrically connected with the second conductive pillar 141 and the first conductive pillar 130. Herein, the transfer wiring combination layer 170 is arranged on the side of the protective layer 150 away from the base wiring combination layer 110, the second chip 160 is mounted to the transfer wiring combination layer 170, and the second encapsulant 180 is arranged on the side of the protective layer 150 away from the base wiring combination layer 110, and wraps the second chip 160.

In this embodiment, the side of the first conductive pillar 130 away from the base wiring combination layer 110 is further provided with a stop ring 133, and the protective layer 150 wraps around the stop ring 133. Specifically, the top end of the first conductive pillar 130 is provided with a stop ring 133, the first conductive pillar can be electrically connected with the transfer wiring combination layer 170 through the stop ring 133, and the protective layer 150 can extend out of the mounting groove 121 and wrap around the stop ring 133, thus serving as a separation layer between the first encapsulant 120 and the second encapsulant 180, ensuring a better plastic packaging standard during plastic packaging.

In this embodiment, the transfer wiring combination layer 170 is electrically connected with the second chip 160, one end of the first conductive pillar 130 and the second conductive pillar 141 are both electrically connected with the transfer wiring combination layer 170, and meanwhile the base wiring combination layer 110 is electrically connected with the other end of the first conductive pillar 130, thereby implementing the overall electrical connection between the first chip 140, the second chip 160, the transfer wiring combination layer 170 and the base wiring combination layer 110.

In this embodiment, the second conductive pillar 141 may have a straight pillar structure to ensure grinding consistency.

In this embodiment, an adhesive film layer 143 is arranged on the back of the first chip 140, and the adhesive film layer 143 is connected with the base wiring combination layer. Herein, the first encapsulant 120 and the second encapsulant 180 can be made of polymer composite materials such as epoxy resin, silica, calcium carbonate, or dibutyl phthalate, and the protective layer 150 functions as buffering and protecting, which protects the first chip 140 in the mounting groove 121 and balances the warping of the first encapsulant 120, so that the protective layer 150 can be made of the same material as the first encapsulant 120, which can also be a colloid or film-covering material, etc.

In summary, according to the chip packaging method and the chip packaging module 100 provided by the embodiments of the present disclosure, firstly the carrier 300 is used to form the first encapsulant 120 thereon, the first conductive pillar 130 is formed in the first encapsulant 120, and the top end of the first conductive pillar 130 is formed with the bump 131, and then the first encapsulant 120 and the bump 131 are etched through a micro-etching process, so that a mounting groove 121 can be formed on the first encapsulant 120, and after partially etching the bump 131, a stop ring 133 is formed between the bump 131 and the first conductive pillar 130, and then a first chip 140 is mounted in the mounting groove 121, wherein the first chip 140 has a flip-chip structure, and the second conductive pillar 141 is arranged on the side away from the carrier 300, then a protective layer 150 is formed by plastic packaging or film covering on the first encapsulant 120, the protective layer 150 can fill the mounting groove 121 and wrap the bump 131 and the first chip 140. Then, a grinding process is performed, wherein the protective layer 150 is ground with the stop ring 133 as the grinding stop layer, so as to expose the stop ring 133 and the second conductive pillar 141. Finally, a second chip 160 is arranged on the side of the protective layer 150 away from the carrier 300, and the second chip 160 can be electrically connected with both the first conductive pillar 130 and the second conductive pillar 141, thus completing the chip stacking and packaging. At last, the carrier 300 is removed, and the base wiring combination layer 110 is formed on the first encapsulant 120, then a single product is formed after ball planting and cutting. Compared with the prior art, in this embodiment, the stop ring 133 is formed by micro-etching, and the stop ring 133 can be used as a stop layer in grinding, so that the grinding height can be determined according to its own structure, excessive grinding can be avoided during grinding, chip safety can be protected, and device reliability can be improved.

Second Embodiment

This embodiment provides a chip packaging method, and its basic steps, principles and technical effects produced are the same as those of the first embodiment. For brief description, please refer to the corresponding contents of the first embodiment for some points not mentioned in this embodiment.

Referring to FIGS. 15*a* to 15*f*, different from the first embodiment, in this embodiment, the second conductive pillar 141 is a conical pillar, and after step S6, the protective layer 150 is completely removed by a third grinding. In addition, the mounting method for the first chip 140 in this embodiment is also different. The chip packaging method includes the following steps S1 to S11.

S1: providing a carrier 300.

Specifically, a substrate 210 or a carrier 300, such as the carrier 300, is taken. The carrier 300 can be made of glass, silicon oxide, metal and other materials.

S2: forming a first encapsulant 120 on the carrier 300.

Figure 15A:
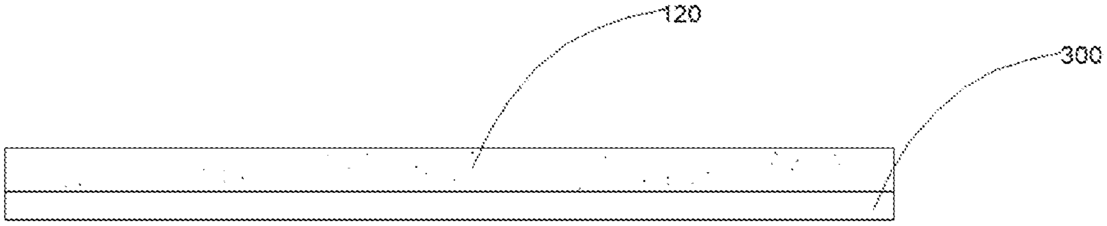
FIGS. 15A to 15F are process flow diagrams of a chip packaging method provided by a second embodiment of the present disclosure.

Referring to FIG. 15*a* in combination, specifically, a liquid adhesive layer (which can be a UV adhesive layer) can be coated using a coating machine by spin coating, then it is soft baked by a hot plate and shaped into a film, and then the liquid plastic packaging process is performed, and the first encapsulant 120 is formed by printing a liquid molding compound and baking. Herein, the adhesive layer can be made of a polymer composite material such as epoxy resin, polyimide and benzocyclobutene, and its material can be separated by irradiating UV light. Meanwhile, the material of the first encapsulant 120 can be a thermosetting material, such as epoxy resin, silicon dioxide, calcium carbonate, dibutyl phthalate and other polymer composite materials.

S3: forming a first conductive pillar 130 in the first encapsulant 120, wherein one end of the first conductive pillar 130 penetrates to the carrier 300, and the other end of the first conductive pillar 130 is provided with a bump 131 protruding relative to the first encapsulant 120.

Figure 15B:
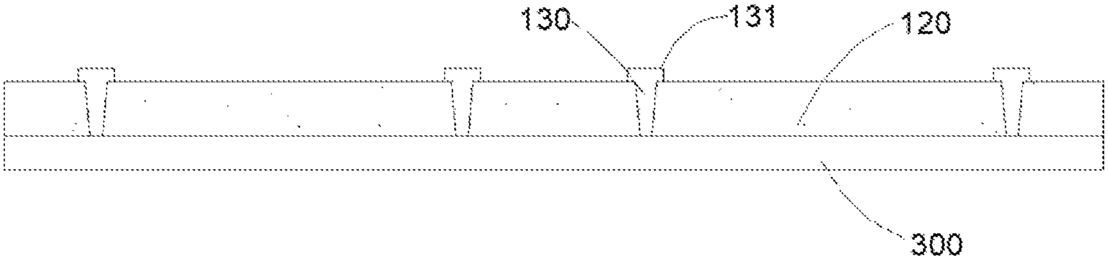

Referring to FIG. 15*b* in combination, specifically, an obconical opening can be firstly formed by laser grooving or etching on the first encapsulant 120, then organic pollutants or impurities can be removed by cleaning process, and water and moisture can be removed by baking again, and then a metal pillar is formed in the opening by an electroplating process. The metal pillar needs to be higher than the molding compound, that is, the metal pillar is the first conductive pillar 130 with a bump 131, wherein the overall height of the bump 131 can be H1.

S4: etching the first encapsulant 120 and the bump 131 to form a mounting groove 121 on the first encapsulant 120, and forming a stop ring 133 between the first conductive pillar 130 and the bump 131.

Figure 15C:
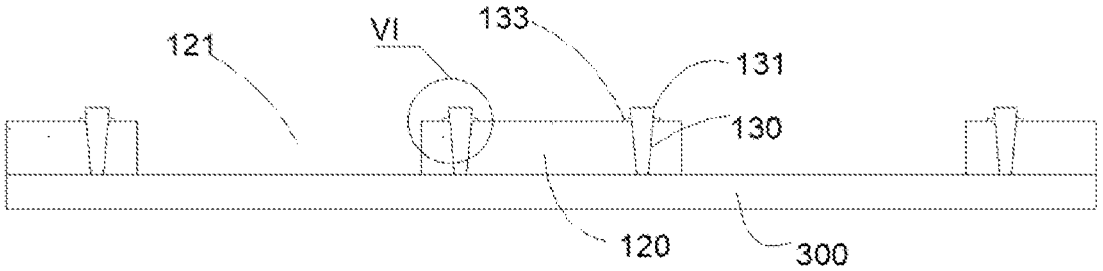
Figure 15D:
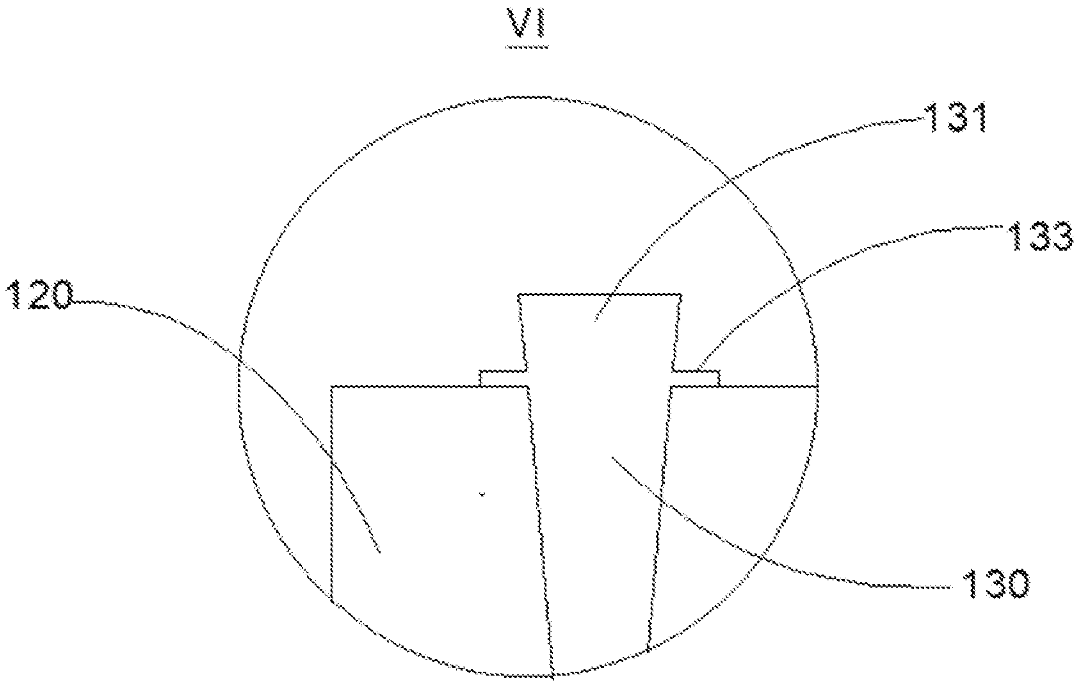

Referring to FIGS. 15*c* and 15*d* in combination, specifically, the first encapsulant 120 and the bump 131 are etched respectively by using a plasma etching technology or a chemical etching technology, and the first encapsulant 120 is etched by using the first etchant, so that the mounting groove 121 is formed on the first encapsulant 120, and the bump 131 is micro-etched by using the second etchant, so that the edge of the bump 131 is etched away and a conical structure is formed. At the same time, a stop ring 133 is formed on the surface of the first encapsulant 120, wherein the height of the stop ring 133 can be H2, and the height of the remaining bump 131 can be H3, where H3+H2=H1.

S5: mounting the first chip 140 in the mounting groove 121, wherein the side of the first chip 140 away from the carrier 300 is provided with a second conductive pillar 141.

Figure 15E:
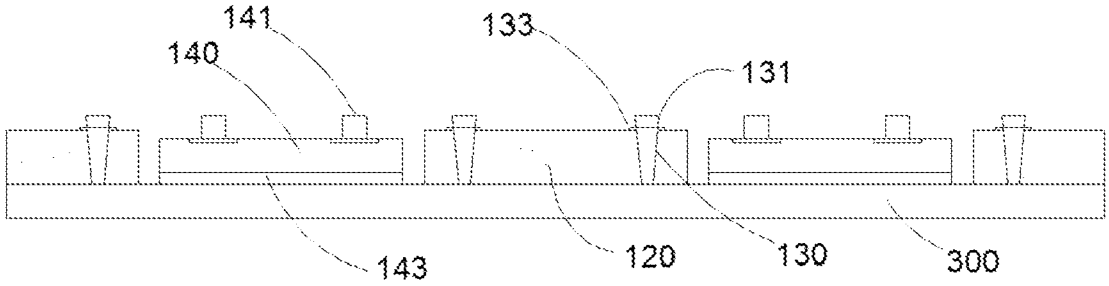

Referring to FIG. 15*e* in combination, specifically, by using a mounting process, the first chip 140 is mounted in the mounting groove 121 with the back facing downwards, and the second conductive pillar 141 extends upward. In this embodiment, the second conductive pillar 141 can have a straight pillar structure, thus ensuring the consistency of the subsequent grinding process. Herein, an adhesive film layer 143 can be arranged on the back of the first chip 140, and the connection between the first chip 140 and the bottom wall of the mounting groove 121 can be implemented through the adhesive film layer 143, so that the bonding force between the adhesive film layer 143 and the adhesive layer of the carrier 300 can be improved, thereby preventing the first chip 140 from being offset due to the impact of mold flow when the protective layer 150 and the second encapsulant 180 are formed subsequently.

S6: performing plastic packaging or film covering on the first encapsulant 120 to form a protective layer 150, wherein the protective layer 150 wraps the bump 131 and the first chip 140.

Figure 15F:
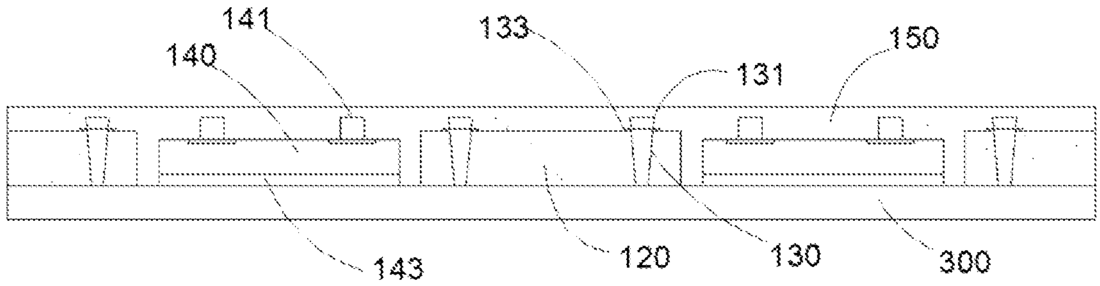

Specifically, referring to FIG. 15*f*, in this embodiment, a protective layer 150 can be formed by film covering, wherein the protective layer 150 can be made of a dielectric material, and the protective layer 150 can completely wrap the bump 131 and the first chip 140, thus functioning as buffering and protecting. Meanwhile, the protective layer 150 can wrap the second conductive pillar 141, which is convenient for subsequent grinding.

Subsequent steps S7 to S11 can refer to the first embodiment.

Figure 16:
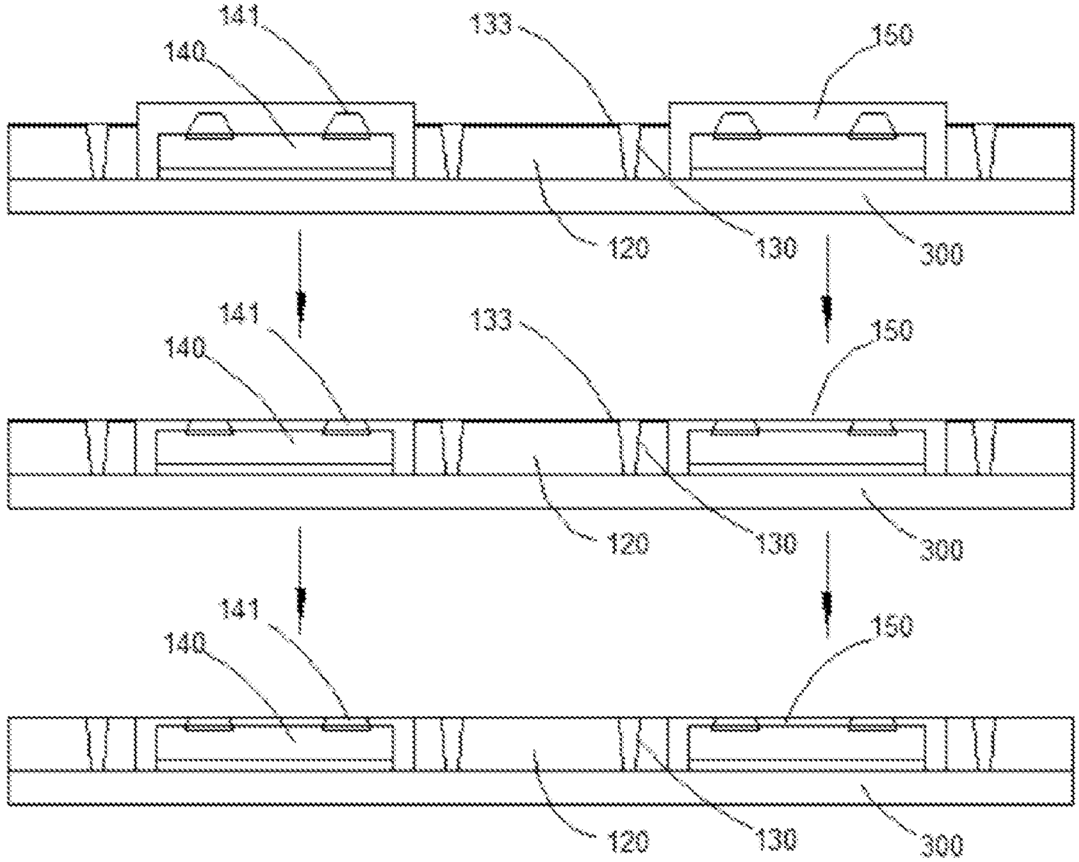
FIG. 16 is a grinding flow diagram of the chip packaging method provided by the second embodiment of the present disclosure.

In this embodiment, referring to FIG. 16, when step S7 is executed, a three-time grinding process can be adopted. In first grinding, a diamond grinding knife can be used to grind the first partition where the bump 131 is located, and the grinding height can be up to the position of the stop ring 133, for example, the grinding height can be H3, so that the grinding parameters can be obtained. Then, second grinding is performed to grind the remaining protective layer 150. The parameters of the first grinding and the second grinding are the same, wherein the grinding mesh number can be 2000 # to 4000 #, the grinding speed can be 1000 r/m to 6000 r/m, and the grinding height is H3, so that the protective layer 150 with the height of H2 remains, and the stop ring 133 and the second conductive pillar 141 are exposed. Finally, third grinding is performed, which also uses a diamond grinding knife, wherein the grinding mesh number can be 8000 # to 12000 #, and the grinding speed can be 500 r/m to 4000 r/m, so that the stop ring 133 is removed by grinding, and the first conductive pillar 130 and the second conductive pillar 141 are ground to the same level. During the third grinding, the first encapsulant 120 at the bottom of the stop ring 133 can be used as the stop layer, and the grinding can be stopped when the cross-sectional area of the stop ring 133 changes suddenly, that is, the cross-section of the stop ring 133 is different from the cross-section of the first conductive pillar 130, when the grinding cross-section changes suddenly, it can be considered that the grinding is in place, so that the first encapsulant 120 can be used as the stop layer, which can also avoid excessive grinding of the second conductive pillar 141. In addition, the use of multiple grinding here can further reduce the grinding resistance and avoid the occurrence of hidden cracks at the bottom of the metal pillar.

In addition, during the second grinding, since the second conductive pillar 141 is a conical pillar, that is, in a structure with a small top and a large bottom, the cross-sectional area will increase with the grinding, and the electrical conductivity of the chip is improved and the height of the metal pillar of the chip is reduced by increasing the cross-sectional area, thus reducing the parasitic effect of the circuit layer.

Figure 17:
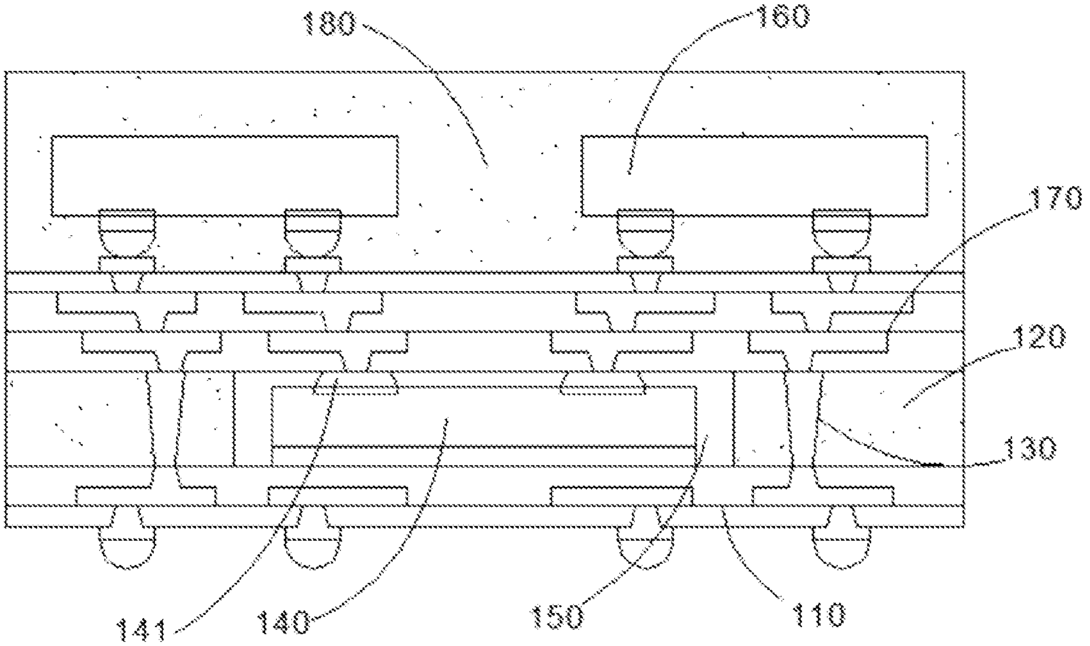
FIG. 17 is a structural schematic diagram of a chip packaging module provided by the second embodiment of the present disclosure.

Referring to FIG. 17, this embodiment provides a chip packaging module 100, and its basic structure, principles and technical effects produced are the same as those of the first embodiment. For brief description, please refer to the corresponding contents of the first embodiment for some points not mentioned in this embodiment. In addition, the chip packaging module 100 is prepared by the aforementioned chip packaging method.

The chip packaging module 100 includes a base wiring combination layer 110, a first encapsulant 120, a first conductive pillar 130, a first chip 140, a protective layer 150, a second chip 160, a transfer wiring combination layer 170 and a second encapsulant 180. Solder balls are arranged on one side of the base wiring combination layer 110, and the first encapsulant 120 is arranged on the other side of the base wiring combination layer 110 and is formed with a mounting groove 121. The first conductive pillar 130 is arranged in the first encapsulant 120, and both ends of the first conductive pillar 130 penetrate to both side surfaces of the first encapsulant 120. The first chip 140 is mounted in the mounting groove 121, and the side of the first chip 140 away from the base wiring combination layer 110 is provided with a second conductive pillar 141. The protective layer 150 is arranged in the mounting groove 121 and wraps the first chip 140, and the second conductive pillar 141 is exposed to the protective layer 150. The second chip 160 is arranged on the side of the protective layer 150 away from the base wiring combination layer 110, and is electrically connected with the second conductive pillar 141 and the first conductive pillar 130. Herein, the transfer wiring combination layer 170 is arranged on the side of the protective layer 150 away from the base wiring combination layer 110, the second chip 160 is mounted on the transfer wiring combination layer 170, and the second encapsulant 180 is arranged on the side of the protective layer 150 away from the base wiring combination layer 110 and wraps the second chip 160.

In this embodiment, the protective layer 150 is flush with the first encapsulant 120 and is arranged in the mounting groove 121, and the second encapsulant 180 can directly contact with the first encapsulant 120, and the plastic packaging materials thereof are consistent, thus ensuring the reliability and bonding strength of the two layers of plastic packaging.

In this embodiment, the width of the second conductive pillar 141 gradually increases along the direction close to the base wiring combination layer 110, so that the second conductive pillar 141 has a frustum shape. Specifically, in the preparation process, the second conductive pillar 141 always keeps conical, and the thickness can be increased to improve the electrical conductivity of the chip and reduce the height of the metal pillar of the chip, thus reducing the parasitic effect of the circuit layer.

According to the chip packaging method and the chip packaging module 100 provided by this embodiment, by adopting the conical second conductive pillar 141, the cross-sectional area of the second conductive pillar 141 will increase with the grinding, and the electrical conductivity of the chip will be improved and the height of the chip metal pillar will be reduced with the increase of the cross-sectional area, thus reducing the parasitic effect of the circuit layer.

Third Embodiment

This embodiment provides a chip packaging method, and its basic steps, principles and technical effects produced are the same as those of the first embodiment or the second embodiment. For brief description, please refer to the corresponding contents of the first embodiment or the second embodiment for some points not mentioned in this embodiment.

Compared with the first embodiment or the second embodiment, in this embodiment, the step of preparing the transfer wiring combination layer 170 is omitted, and the second chip 160 is directly mounted on the protective layer 150 and the first encapsulant 120. Specifically, after the execution of step S7, the second chip 160 can be directly surface-mounted on the surface of the protective layer 150, and the second chip 160 is directly connected with both the first conductive pillar 130 and the second conductive pillar 141, thereby omitting the step of preparing the transfer wiring combination layer 170, which shortens the circuit layer paths between adjacent second chips 160 and between the second chip 160 and the first chip 140, and meanwhile shortens the transmission path between the second chip 160 and the first conductive pillar 130 and the second conductive pillar 141, thus improving the electrical performance and reducing the skin effect, that is, the transmission loss caused by the phenomenon that current tends to flow on the wiring surface. Meanwhile, it can reduce the inductance effect between wiring layers caused by current, that is, it can avoid short circuit and overheating, etc. between wiring layers caused by leakage due to parasitic inductance.

Figure 18:
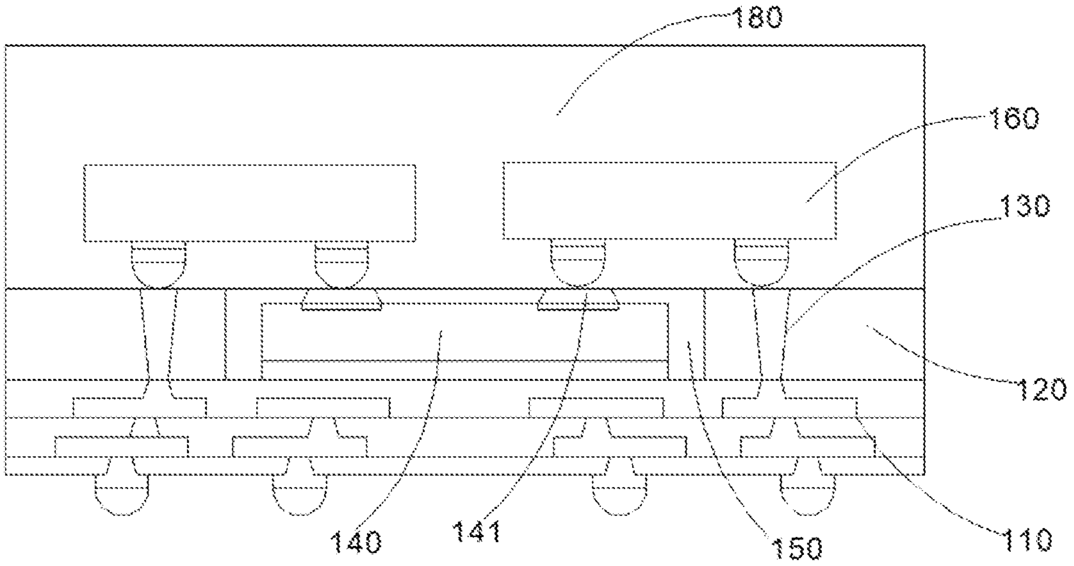
FIG. 18 is a structural schematic diagram of a chip packaging module provided by a third embodiment of the present disclosure.

Referring to FIG. 18, this embodiment further provides a chip packaging module 100, and its basic structure, principles and technical effects produced are the same as those of the first embodiment or the second embodiment. For brief description, please refer to the corresponding contents of the first embodiment for some points not mentioned in this embodiment. In addition, the chip packaging module 100 is prepared by the aforementioned chip packaging method.

The chip packaging module 100 includes a base wiring combination layer 110, a first encapsulant 120, a first conductive pillar 130, a first chip 140, a protective layer 150, a second chip 160 and a second encapsulant 180, wherein solder balls are arranged on one side of the base wiring combination layer 110, and the first encapsulant 120 is arranged on the other side of the base wiring combination layer 110 and is formed with a mounting groove 121. The first conductive pillar 130 is arranged in the first encapsulant 120, and both ends of the first conductive pillar 130 penetrate to both side surfaces of the first encapsulant 120. The first chip 140 is mounted in the mounting groove 121, and the side of the first chip 140 away from the base wiring combination layer 110 is provided with a second conductive pillar 141. The protective layer 150 is arranged in the mounting groove 121 and wraps the first chip 140, and the second conductive pillar 141 is exposed to the protective layer 150. The second chip 160 is arranged on the side of the protective layer 150 away from the base wiring combination layer 110, and is connected with the second conductive pillar 141 and the first conductive pillar 130. The second encapsulant 180 is arranged on the side of the protective layer 150 away from the base wiring combination layer 110 and wraps the second chip 160.

In this embodiment, since the transfer wiring combination layer 170 is omitted, there is no wiring layer structure between the first chip 140 and the second chip 160, which shortens the circuit layer paths between adjacent second chips 160 and between the second chip 160 and the first chip 140, and meanwhile shortens the transmission path between the second chip 160 and the first conductive pillar 130 and the second conductive pillar 141, thus improving the electrical performance and reducing the skin effect, that is, the transmission loss caused by the phenomenon that current tends to flow on the wiring surface. Meanwhile, it can reduce the inductance effect between wiring layers caused by current, that is, it can avoid short circuit and overheating, etc. between wiring layers caused by leakage due to parasitic inductance.

Fourth Embodiment

Figure 19:
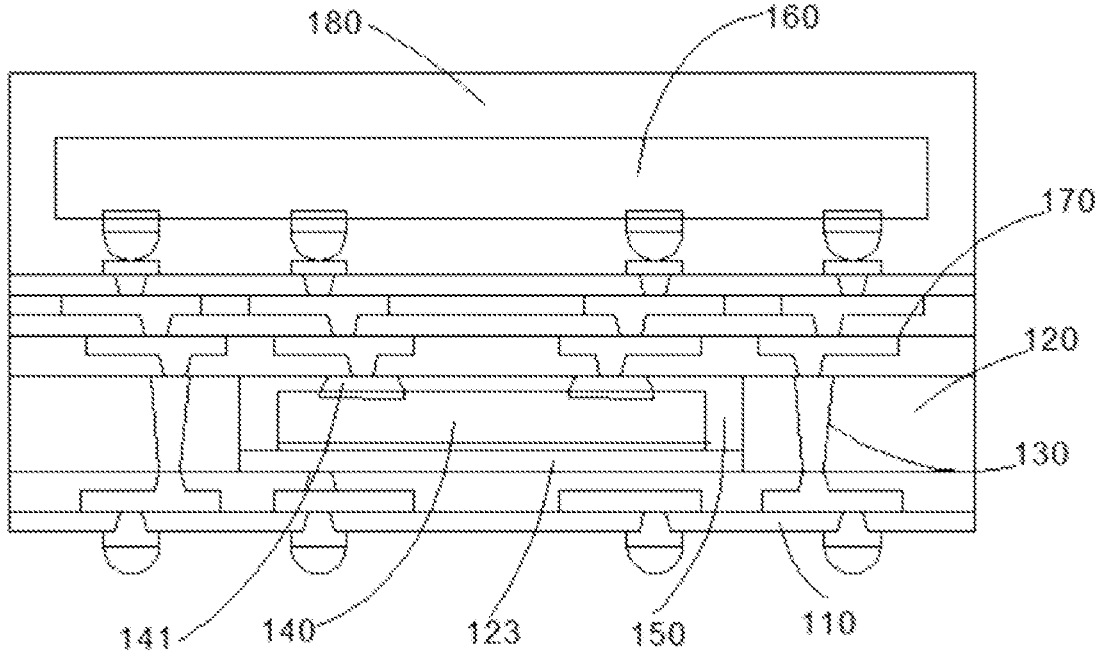
FIG. 19 is a structural schematic diagram of a chip packaging module provided by a fourth embodiment of the present disclosure.

Referring to FIG. 19, this embodiment further provides a chip packaging method, and its basic steps, principles and technical effects produced are the same as those of the first embodiment or the second embodiment. For brief description, please refer to the corresponding contents of the first embodiment or the second embodiment for some points not mentioned in this embodiment.

Compared with the first embodiment or the second embodiment, in this embodiment, a metal conductive layer 123 is added in the mounting groove 121, and before step S5, the method further includes the step of arranging the metal conductive layer 123 at the bottom of the mounting groove 121, and the metal conductive layer 123 is configured for connecting with the ground point 113 of the subsequently prepared base wiring combination layer 110.

In this embodiment, when step S3 is executed, the metal conductive layer 123 can be formed at the same time, that is, the metal conductive layer 123 is electroplated and formed in the mounting groove 121 by electroplating process, and when step S9 is executed, the ground point 113 of the base wiring combination layer 110 can be connected with the metal conductive layer 123. Specifically, the ground point 113 can be a metal pillar, one end of which is connected with the metal layer of the base wiring combination layer 110, and the other end is connected with the metal conductive layer 123, and is connected to the ground pad through the metal layer.

Certainly, in other optional embodiments of the present disclosure, the metal conductive layer 123 may be additionally prepared in the mounting groove 121 before the first chip 140 is mounted, for example, the metal conductive layer 123 may be additionally electroplated on the bottom wall of the mounting groove 121 through an electroplating process.

When step S5 is executed, the first chip 140 may be mounted on the metal conductive layer 123.

This embodiment further provides a chip packaging module 100, and its basic structure, principles and technical effects produced are the same as those of the first embodiment. For brief description, please refer to the corresponding contents of the first embodiment for some points not mentioned in this embodiment.

The chip packaging module 100 provided by this embodiment is prepared by the aforementioned chip packaging method. Compared with the first embodiment or the second embodiment, in this embodiment, a metal conductive layer 123 is added in the mounting groove 121, wherein the back of the first chip 140 is mounted on the metal conductive layer 123 through an adhesive layer, and the metal conductive layer 123 is electrically connected with the ground point 113 of the base wiring combination layer. In addition, the metal conductive layer 123 can also function as heat dissipating, improving the heat dissipation effect of the package structure. Moreover, the metal conductive layer 123 is connected with the ground point 113, so that static electricity can be released, thereby releasing the static electricity around the first chip 140 in the mounting groove 121 and achieving static electricity dissipation. Finally, the metal conductive layer 123 can also function as electromagnetic shielding, improving the electromagnetic shielding effect around the first chip 140.

Fifth Embodiment

Figure 20:
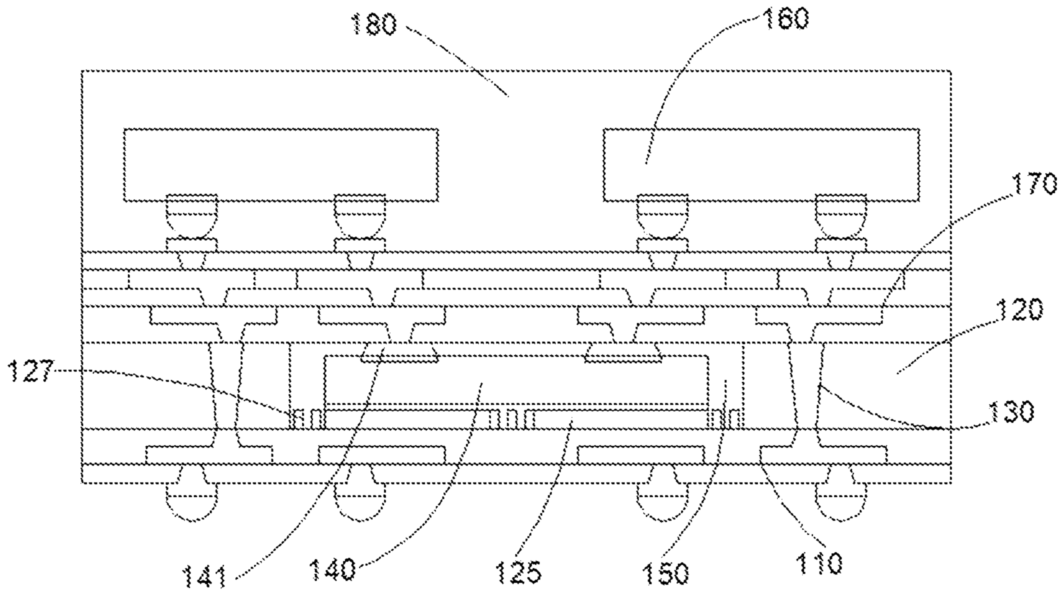
FIG. 20 is a structural schematic diagram of a chip packaging module provided by a fifth embodiment of the present disclosure.

Referring to FIG. 20, this embodiment provides a chip packaging method, and its basic steps, principles and technical effects produced are the same as those of the first embodiment or the second embodiment. For brief description, please refer to the corresponding contents of the first embodiment or the second embodiment for some points not mentioned in this embodiment.

Compared with the first embodiment or the second embodiment, in this embodiment, a metal heat dissipation layer 125 is added in the mounting groove 121, and before step S5, the method further includes the step of arranging the metal heat dissipation layer 125 at the bottom of the mounting groove 121.

Specifically, before executing step S5, the packaging method further includes the following steps: arranging a metal heat dissipation layer 125 on the bottom wall of the mounting groove 121, and grooving on the metal heat dissipation layer 125 to form a heat dissipation groove 127.

Specifically, micro-etching can be used to form heat dissipation grooves 127 at both ends and the middle of the metal heat dissipation layer 125, and then the first chip 140 can be mounted. The heat dissipation groove 127 can improve the bonding force between the adhesive film layer 143 on the back of the first chip 140 and the metal heat dissipation layer 125, and prevent the delamination of the adhesive film layer 143 for the first chip 140. At the same time, the heat dissipation area is increased through the heat dissipation groove 127, and the heat dissipation performance is improved.

This embodiment further provides a chip packaging module 100, and its basic structure, principles and technical effects produced are the same as those of the first embodiment or the second embodiment. For brief description, please refer to the corresponding contents of the first embodiment or the second embodiment for some points not mentioned in this embodiment.

The chip packaging module 100 provided by this embodiment is prepared by the aforementioned chip packaging method. Compared with the first embodiment or the second embodiment, in this embodiment, a metal heat dissipation layer 125 is added in the mounting groove 121, wherein the back surface of the first chip 140 is mounted to the metal heat dissipation layer 125 through an adhesive layer, and a heat dissipation groove 127 is further provided on the metal heat dissipation layer 125. Specifically, the bottom wall of the mounting groove 121 is further provided with a metal heat dissipation layer 125, the first chip 140 is mounted on the metal heat dissipation layer 125, and a heat dissipation groove 127 is further formed on the metal heat dissipation layer 125 by grooving.

In the chip packaging module 100 provided by this embodiment, by arranging the metal heat dissipation layer 125, and arranging heat dissipation grooves 127 at both ends and the middle of the metal heat dissipation layer 125, the metal heat dissipation layer 125 can achieve a good heat dissipation effect by itself. Meanwhile, the heat dissipation grooves 127 can improve the bonding force between the adhesive film layer 143 on the back of the first chip 140 and the metal heat dissipation layer 125, and prevent the delamination of the adhesive film layer 143 on the first chip 140.

At the same time, the heat dissipation area is increased through the heat dissipation groove 127, and the heat dissipation performance is improved.

Sixth Embodiment

Figure 21:
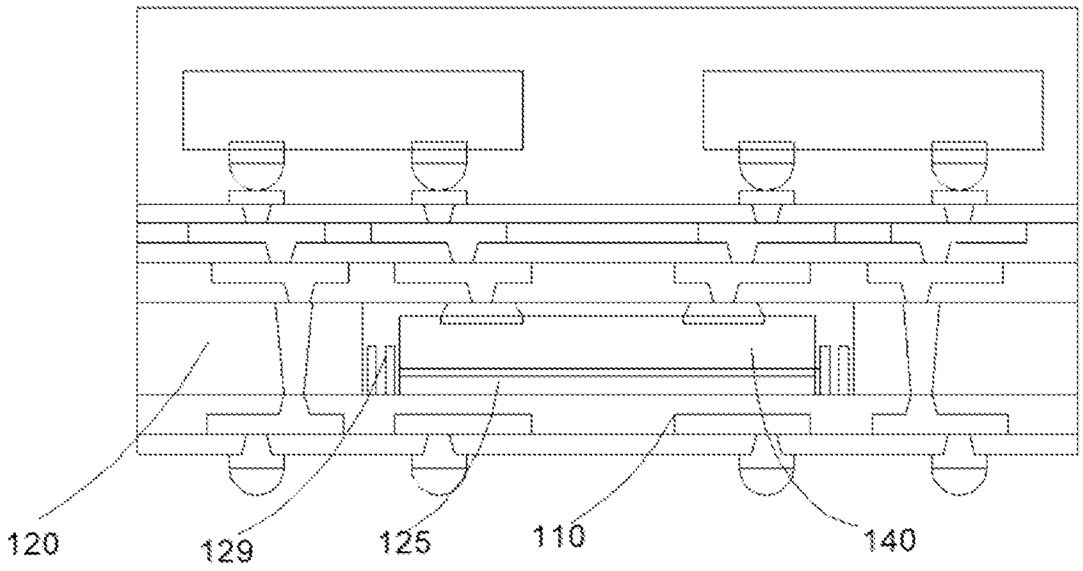
FIG. 21 is a structural schematic diagram of a chip packaging module provided by a sixth embodiment of the present disclosure.

Referring to FIG. 21, this embodiment provides a chip packaging method, and its basic steps, principles and technical effects produced are the same as those of the first embodiment or the second embodiment. For brief description, please refer to the corresponding contents of the first embodiment or the second embodiment for some points not mentioned in this embodiment.

Compared with the first embodiment or the second embodiment, in this embodiment, a metal heat dissipation layer 125 is added in the mounting groove 121, and at least both ends of the metal heat dissipation layer 125 are provided with heat dissipation metal pillars 129. Specifically, before step S5, the method further includes the step of providing the metal heat dissipation layer 125 at the bottom of the mounting groove 121.

Specifically, before executing step S5, the packaging method further includes the following steps: arranging a metal heat dissipation layer 125 on the bottom wall of the mounting groove 121; etching the metal heat dissipation layer 125, and forming heat dissipation metal pillars 129 on at least both ends of the metal heat dissipation layer 125, and optionally, the heat dissipation metal pillars 129 can be formed around the metal heat dissipation layer 125.

Specifically, the middle of the metal heat dissipation layer 125 can be etched away by micro-etching, and the heat dissipation metal pillars 129 can be etched at both ends of the metal heat dissipation layer 125, and then the first chip 140 can be mounted. The heat dissipation metal pillars 129 can be arranged around the first chip 140, so as to use the heat dissipation metal pillars 129 to function as electromagnetic shielding and electrostatic dissipating. In addition, the heat dissipation metal pillars 129 can also prevent the adhesive film layer 143 from shifting and avoid the adhesive film layer 143 from flowing when it is not fixed during mounting of the first chip 140. Moreover, the adhesive film layer 143 here can be an indium metal adhesive layer. Since reflow soldering using indium material needs to use flux, wherein the flux is volatile and the melting point of indium material is low, during reflow, the flux continuously releases gas, which will crowd out the melted heat dissipation metal layer, causing the formed mixture to overflow to the first chip 140 below, so that the structure of the first chip 140 is affected. Meanwhile, too much mixture overflow will result in a large number of voids between the chip and the heat dissipation cover, which affects the heat dissipation performance of its products.

This embodiment further provides a chip packaging module 100, and its basic structure, principles and technical effects produced are the same as those of the first embodiment or the second embodiment. For brief description, please refer to the corresponding contents of the first embodiment or the second embodiment for some points not mentioned in this embodiment.

The chip packaging module 100 provided by this embodiment is prepared by the aforementioned chip packaging method. Compared with the first embodiment or the second embodiment, in this embodiment, a metal heat dissipation layer 125 is added in the mounting groove 121, and heat dissipation metal pillars 129 are arranged around the metal heat dissipation layer 125, wherein the back of the first chip 140 is mounted on the metal heat dissipation layer 125 through an adhesive layer, and a heat dissipation metal pillar 129 is further arranged on the metal heat dissipation layer 125. Specifically, the bottom wall of the mounting groove 121 is further provided with a metal heat dissipation layer 125, the first chip 140 is mounted on the metal heat dissipation layer 125, and the metal heat dissipation layer 125 is further provided with a heat dissipation metal pillar 129.

In the chip packaging module 100 provided by this embodiment, by arranging the metal heat dissipation layer 125, and arranging the heat dissipation metal pillars 129 around the metal heat dissipation layer 125, the metal heat dissipation layer 125 can achieve a good heat dissipation effect by itself. Meanwhile, the heat dissipation metal pillars 129 can be used to achieve electromagnetic shielding and electrostatic dissipation, and the heat dissipation metal pillars 129 can function as limiting the adhesive film layer 143 to prevent its fluidity from affecting the package structure.

Seventh Embodiment

Figure 22:
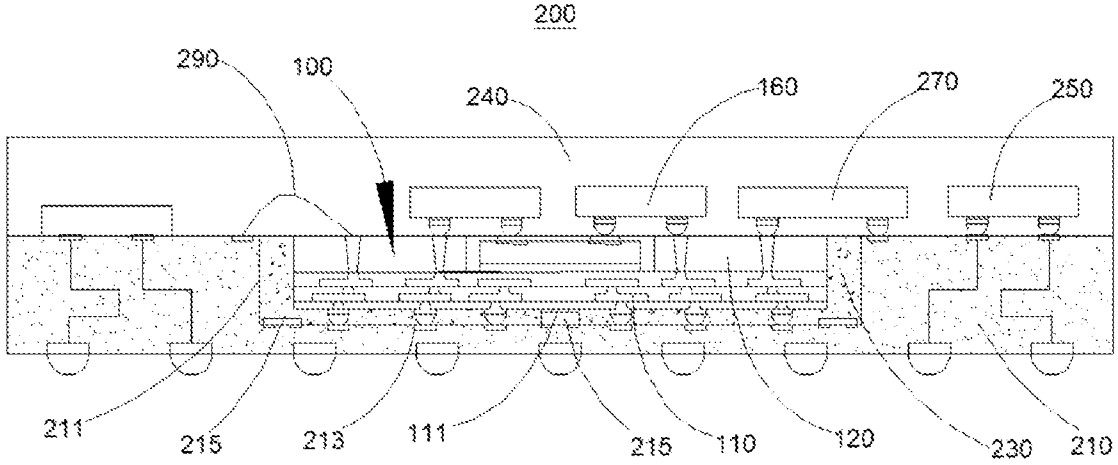
FIG. 22 is a schematic diagram of an embedded substrate chip packaging structure provided by a seventh embodiment of the present disclosure.

Referring to FIG. 22, this embodiment provides an embedded substrate chip packaging structure 200, which includes a substrate 210 and a chip packaging module 100, wherein a circuit layer is arranged in the substrate 210, a module groove 211 is arranged on one side of the substrate 210, and the chip packaging module 100 is mounted in the module groove 211 and electrically connected with the circuit layer. Herein, the basic structure, principles, and technical effects produced by the chip packaging module 100 are the same as those in the third embodiment. For brief description, please refer to the corresponding contents of the third embodiment for some points not mentioned in this embodiment.

In this embodiment, the chip packaging module 100 is different from the third embodiment in that a second encapsulant 180 is further omitted, and after the chip packaging module 100 is mounted, a third encapsulant 240 is formed on the substrate 210 to protect the chip packaging module 100 and devices on the substrate 210.

It should be noted that the substrate 210 in this embodiment can further be a base board, a lead frame, a ceramic substrate, a PCB board, or an epoxy glass fiber cloth substrate, and the material of the substrate 210 can be silicon dioxide, silicon nitride, etc. One side surface of the substrate 210 is provided with a module groove 211 structure, and the other side surface is provided with pads and solder balls electrically connected with the circuit layer. By mounting the chip packaging module 100 into the module groove 211, the integration level can be improved, and the package volume can be reduced.

In this embodiment, the bottom wall of the module groove 211 is provided with a substrate pad 213 and a plurality of passive devices 215 electrically connected with the circuit layer. The base wiring combination layer 110 and the first encapsulant 120 are accommodated in the module groove 211, and solder balls are connected with the substrate pad 213. The passive devices 215 are at least partially located on the side of the base wiring combination layer 110 away from the first chip 140, and the side of the base wiring combination layer 110 away from the first chip 140 is further provided with a transfer pad 111, and the transfer pad 111 is connected with at least one passive device 215. Specifically, by arranging the substrate pad 213 on the surface of the module groove 211, and mounting the passive device 215 to the bottom wall of the module groove 211, the integration level can be improved, and by mounting the chip packaging module 100 again, the passive device 215 can be covered, and the integration of the high-density passive device 215 can be implemented, further reducing the package volume.

Specifically, the transfer pad 111 is arranged in the center of the base wiring combination layer 110, and the module groove 211 is formed with a fixing adhesive layer 230 by filling, wherein the surfaces of the fixing adhesive layer 230, the first encapsulant 120 and the substrate 210 around the module groove 211 are flush, and the substrate 210 is further provided with a connecting wire arc 290, one end of the connecting wire arc 290 is electrically connected with the circuit layer, and the other end is connected with the first conductive pillar 130. The electrical bridge between the substrate 210 and the chip packaging module 100 can be implemented by wire bonding. Meanwhile, the fixing adhesive layer 230 can cover and protect the bottom of the package structure of the chip, achieving protection effect.

In this embodiment, by arranging the transfer pad 111 on the back of the base wiring combination layer 110, during its mounting, the base wiring layer can cover the surface of the passive device 215 at the central position, so that the passive device 215 at the central position can be soldered on the base wiring combination layer 110. Here, the passive device 215 can be components, inductors, etc., and both side surfaces of the passive device 215 are covered with tin solder, and are fixed by reflow soldering. The substrate pad 213 arranged on the substrate 210 can also be connected with the passive device 215 at the central position, so that the chip packaging module 100 and the substrate 210 share one passive device 215, thus shortening the wiring path and improving the transmission effect.

In this embodiment, the surface of the substrate 210 is also mounted with a third chip 250 and a fourth chip 270. The third chip 250 is mounted to the surface of the substrate 210 around the module groove 211 and connected with the circuit layer. The fourth chip 270 is mounted to the edge of the module groove 211, and is arranged between the substrate 210 and the first encapsulant 120. The fourth chip 270 is connected with the first conductive pillar 130 and electrically connected with the circuit layer.

It is worth noting that in this embodiment, the third chip 250 and the fourth chip 270 can be active devices, and high-density integrated packaging can be implemented by stacking the third chip 250 on the substrate 210, while the fourth chip 270 is a bridge chip, which can implement the electrical connection between the substrate 210 and the chip packaging module 100.

In summary, this embodiment provides an embedded substrate chip packaging structure 200. By grooving on the substrate 210 to form a module groove 211, and mounting the chip packaging module 100 prepared in advance into the module groove 211, the embedded stacking structure is implemented, which improves integration level of chip packaging, and reduces the packaging volume. Meanwhile, the electrical connection between the chip packaging module 100 and the substrate 210 is implemented by wire bonding and chip bridging, so as to ensure the electrical connection efficiency. At the same time, the passive device 215 is additionally arranged in the module groove 211, so that the chip packaging module 100 covers the passive device 215, and the packaging integration level of the passive device 215 is improved.

Eighth Embodiment

Figure 23:
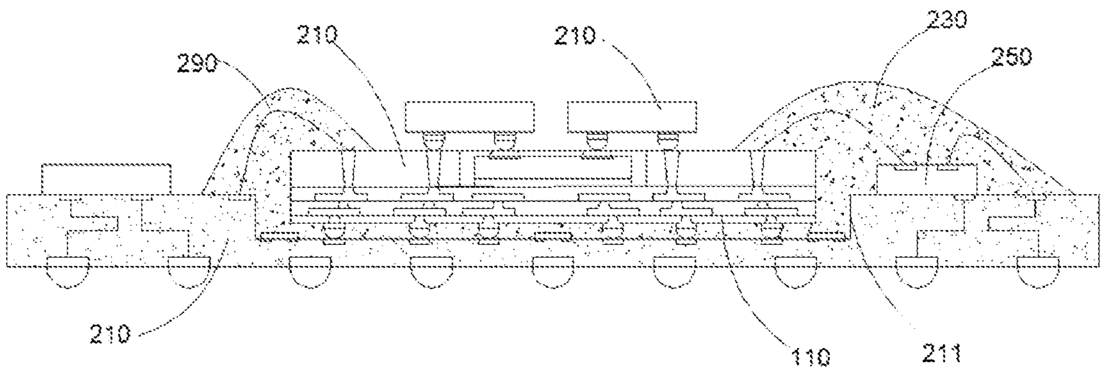
FIG. 23 is a schematic diagram of an embedded substrate chip packaging structure provided by an eighth embodiment of the present disclosure.

Referring to FIG. 23, this embodiment provides an embedded substrate chip packaging structure 200, which includes a substrate 210 and a chip packaging module 100, wherein a circuit layer is arranged in the substrate 210, a module groove 211 is arranged on one side of the substrate 210, and the chip packaging module 100 is mounted in the module groove 211 and electrically connected with the circuit layer. Herein, the basic structure, principles, and technical effects produced by the chip packaging module 100 are the same as those in the third embodiment. For brief description, please refer to the corresponding contents of the third embodiment for some points not mentioned in this embodiment.

It should be noted that for the embedded substrate chip packaging structure 200 of this embodiment, its basic structure, principles and technical effects produced are the same as those of the seventh embodiment. For brief description, please refer to the corresponding contents of the seventh embodiment for some points not mentioned in this embodiment.

Compared with the seventh embodiment, this embodiment is different in the height of the module groove 211.

In this embodiment, the bottom wall of the module groove 211 is provided with a substrate pad 213 electrically connected with the circuit layer, wherein the base wiring combination layer 110 is accommodated in the module groove 211, the first encapsulant 120 is convexly arranged on the substrate 210, solder balls are connected with the substrate pad 213, the surface of the substrate 210 around the module groove 211 is further provided with a third chip 250, the first conductive pillar 130 is provided with a connecting wire arc 290, and the connecting wire arc 290 is connected with the substrate 210 or the third chip 250.

In this embodiment, since the substrate 210 is not flush with the first encapsulant 120, the bridge chip is omitted in this embodiment, and the bridge is implemented only by wire bonding. Meanwhile, the fixing adhesive layer 230 can further cover the wire bonding structure, thus protecting the wire bonding structure. In addition, the side wall of the chip packaging module 100 can be used as a blocking wall to force the underfilling colloid to enter the bottom of the module groove 211, thereby improving the underfilling of the colloid of the fixing adhesive layer 230, and avoiding the occurrence of voids. By arranging the fixing adhesive layer 230, the side wall and bottom of the chip packaging module 100 can be effectively protected, thereby preventing cracks in the structure.

In this embodiment, the third chip 250 is a flip chip, which can also implement the function of electrical interconnection. The third chip 250 is electrically connected with the chip packaging module 100 through wire bonding, and also is electrically connected with the substrate 210 through wire bonding, so that the chip packaging module 100 is electrically interconnected with the substrate 210, which shortens the wiring path and improves the electrical performance. In addition, one electrical interconnection chip can be shared, which can further improve the integration level and reduce the package size.

Ninth Embodiment

Figure 24:
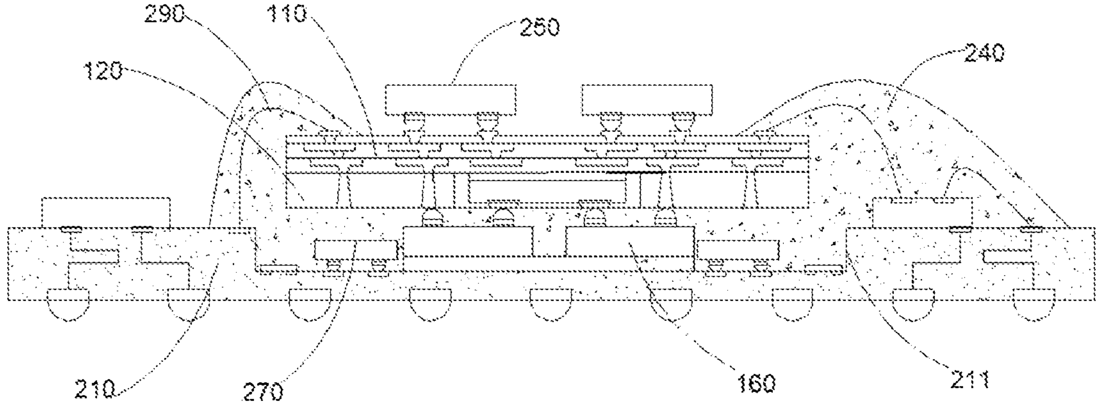
FIG. 24 is a schematic diagram of an embedded substrate chip packaging structure provided by a ninth embodiment of the present disclosure.

Referring to FIG. 24, this embodiment provides an embedded substrate chip packaging structure 200, which includes a substrate 210 and a chip packaging module 100, wherein a circuit layer is arranged in the substrate 210, a module groove 211 is arranged on one side of the substrate 210, and the chip packaging module 100 is mounted in the module groove 211 and electrically connected with the circuit layer. Herein, the basic structure, principles and technical effects produced by the chip packaging module 100 are the same as those in the third embodiment. For brief description, please refer to the corresponding contents of the third embodiment for some points not mentioned in this embodiment.

It should be noted that for the embedded substrate chip packaging structure 200 of this embodiment, its basic structure, principles and technical effects produced are the same as those of the seventh embodiment. For brief description, please refer to the corresponding contents of the seventh embodiment for some points not mentioned in this embodiment.

Compared with the seventh embodiment, the chip packaging module 100 in this embodiment has an inverted structure.

In this embodiment, the chip packaging module 100 is installed in the module groove 211 with the second chip 160 facing downwards. Herein, the second chip 160 is accommodated in the module groove 211, the base wiring combination layer 110 is convexly arranged on the substrate 210, a third chip 250 is mounted on the side of the base wiring combination layer 110 away from the second chip 160, and a connecting wire arc 290 is arranged on the base wiring combination layer 110, wherein the connecting wire arc 290 is connected with the substrate 210. A fourth chip 270 is further arranged in the module groove 211, and the fourth chip 270 is located at both sides of the second chip 160. In addition, the module groove 211 is filled with a fixing adhesive layer 230, and the fixing adhesive layer 230 can wrap the connecting wire arcs 290 on both sides at the same time.

Optionally, in this embodiment, the connecting wire arc 290 can be arranged around the periphery of the base wiring combination layer 110, and the fourth chip 270 is located inside the connecting wire arc 290, so that the connecting wire arc 290 achieve an electromagnetic shielding effect, and improve the electromagnetic shielding performance of the fourth chip 270.

In this embodiment, the chip packaging module 100 adopts a flip-chip structure, so that the effective area of the base wiring combination layer on the back of the chip packaging module 100 can be widened, and a third chip 250 can be mounted on the back again, thus the integration of more chips can be implemented, and the structural utilization rate of the chip packaging module 100 can be greatly improved, thereby improving the integration level, reducing the package size and improving the electrical performance.

In this embodiment, the bridge between the chip packaging module 100 and the substrate 210 is implemented by wire bonding, and the second chip 160 is mounted in the module groove 211, so that the bottom space of the module groove 211 can be greatly increased, and more active devices and passive devices 215 can be integrated in the module groove 211, thus further improving the integration level.

In this embodiment, the first encapsulant 120 is also convexly arranged on the substrate 210, and the height of the side surface of the first encapsulant 120 away from the base wiring combination layer 110 relative to the surface of the substrate 210 is H1, thereby improving the fluidity of the fixing adhesive layer 230 into the module groove 211, and achieving better underfilling performance.

Tenth Embodiment

Figure 25:
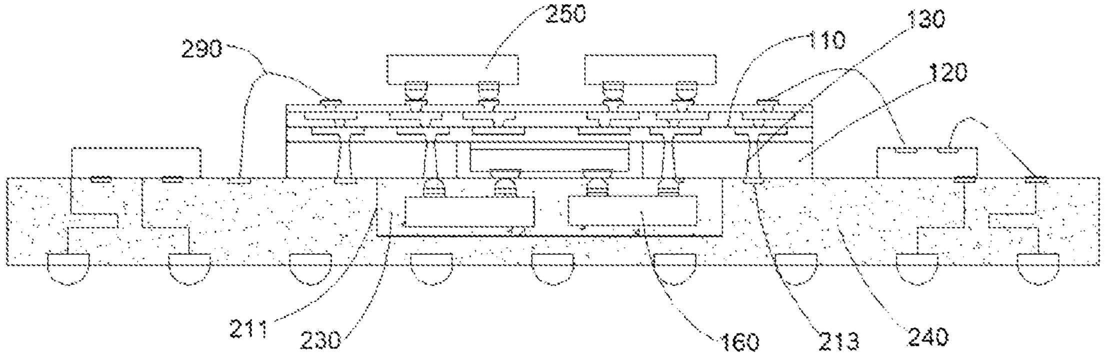
FIG. 25 is a schematic diagram of an embedded substrate chip packaging structure provided by a tenth embodiment of the present disclosure.

Referring to FIG. 25, this embodiment provides an embedded substrate chip packaging structure 200, which includes a substrate 210 and a chip packaging module 100, wherein a circuit layer is arranged in the substrate 210, a module groove 211 is arranged on one side of the substrate 210, and the chip packaging module 100 is mounted in the module groove 211 and electrically connected with the circuit layer. Herein, the basic structure, principles and technical effects produced by the chip packaging module 100 are the same as those in the third embodiment. For brief description, please refer to the corresponding contents of the third embodiment for some points not mentioned in this embodiment.

It should be noted that for the embedded substrate chip packaging structure 200 of this embodiment, its basic structure, principles and technical effects produced are the same as those of the seventh embodiment. For brief description, please refer to the corresponding contents of the seventh embodiment for some points not mentioned in this embodiment.

Compared with the seventh embodiment, the chip packaging module 100 in this embodiment has an inverted structure.

In this embodiment, the second chip 160 is accommodated in the module groove 211, wherein the base wiring combination layer 110 and the first encapsulant 120 are convexly arranged on the substrate 210, the first encapsulant 120 is overlapped on the substrate 210, the substrate 210 around the module groove 211 is further provided with a substrate pad 213, the first conductive pillar 130 is connected with the substrate pad 213, and the module groove 211 is filled with a fixing adhesive layer 230; and wherein a third chip 250 is mounted to the side of the base wiring combination layer 110 away from the second chip 160, the base wiring combination layer 110 is provided with a connecting wire arc 290, and the connecting wire arc 290 is connected with the substrate 210. Specifically, the first conductive pillar 130 is connected with the substrate pad 213, so that the electrical connection between the chip packaging module 100 and the substrate 210 can be implemented. Meanwhile, the fixing adhesive layer 230 is only accommodated in the module groove 211 to protect the second chip 160.

In this embodiment, the width of the module groove 211 needs to be smaller than the width of the first encapsulant 120, so that only the second chip 160 can be mounted into the module groove 211, and the chip packaging module 100 can be directly mounted on the surface of the substrate 210. Herein, an adhesive material can be provided around the module groove 211, and the chip packaging module 100 can be mounted by the adhesive material.

In this embodiment, a TSV pad can be additionally arranged at the end of the first conductive pillar 130 away from the base wiring combination layer 110, and the first conductive pillar 130 can be soldered with the substrate pad 213 through the TSV pad, thereby implementing the electrical connection between the first conductive pillar 130 and the substrate 210. The soldering material can be conductive metal particles made of, for example, solder paste or conductive adhesive. By arranging the substrate pad 213 and the TSV pad, a bidirectional interconnection structure can be implemented, thereby improving its electrical transmission performance.

In this embodiment, for the fixing adhesive layer 230, colloid can be filled around the chip packaging module 100, and the bottom can be filled by using the fluidity of the colloid and the gap between the TSV pad and the substrate 210. Meanwhile, there is a gap height H between the second chip 160 and the bottom wall of the module groove 211, so as to better improve the fluidity of the colloid in the module groove 211.

Of course, the adhesive layer 230 here can adopt vacuum film covering or thermoplastic colloid to mount the chip packaging module 100, and the second chip 160 is embedded in the module groove 211 by heating. If this method is adopted, the second chip 160 can be directly mounted on the bottom wall of the module groove 211 without leaving the gap height H.

Eleventh Embodiment

Figure 26:
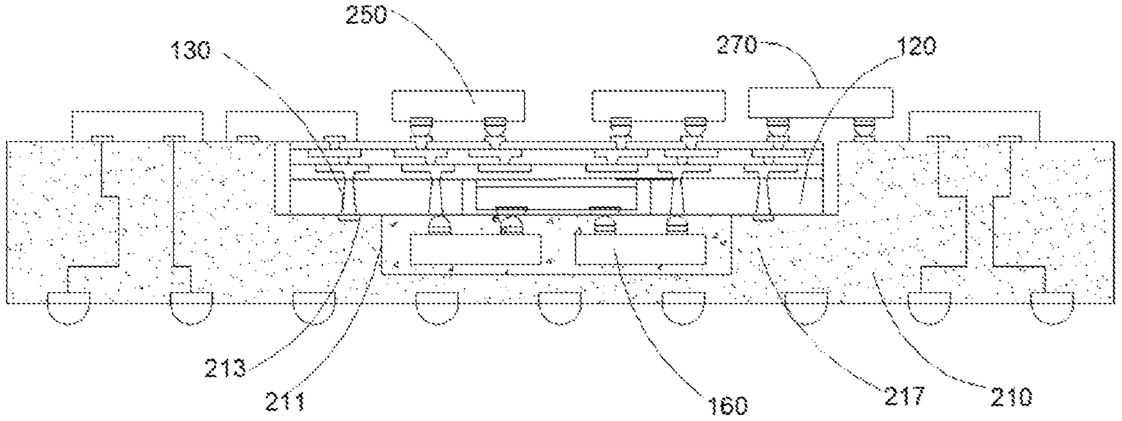
FIG. 26 is a schematic diagram of an embedded substrate chip packaging structure provided by an eleventh embodiment of the present disclosure.

Referring to FIG. 26, this embodiment provides an embedded substrate chip packaging structure 200, which includes a substrate 210 and a chip packaging module 100, wherein a circuit layer is arranged in the substrate 210, a module groove 211 is arranged on one side of the substrate 210, and the chip packaging module 100 is mounted in the module groove 211 and electrically connected with the circuit layer. Herein, the basic structure, principles and technical effects produced by the chip packaging module 100 are the same as those in the third embodiment. For brief description, please refer to the corresponding contents of the third embodiment for some points not mentioned in this embodiment.

It should be noted that for the embedded substrate chip packaging structure 200 of this embodiment, its basic structure, principles and technical effects produced are the same as those of the seventh embodiment. For brief description, please refer to the corresponding contents of the seventh embodiment for some points not mentioned in this embodiment.

Compared with the seventh embodiment, the chip packaging module 100 in this embodiment has an inverted structure.

In this embodiment, the second chip 160, the first encapsulant 120 and the base wiring combination layer 110 are all accommodated in the module groove 211. Both sides of the bottom of the module groove 211 are further provided with limiting steps 217, the first encapsulant 120 is overlapped on the limiting steps 217, and the limiting steps 217 are further provided with a substrate pad 213, wherein the first conductive pillar 130 is connected with the substrate pad 213. The base wiring combination layer 110 is flush with the surface of the substrate 210 around the module groove 211, and a third chip 250 and a fourth chip 270 are mounted to the side of the base wiring combination layer 110 away from the second chip 160, wherein the third chip 250 is directly connected with the base wiring combination layer, and the fourth chip 270 is mounted to on edge of the module groove 211, and is arranged between the substrate 210 and the first encapsulant 120, and wherein the fourth chip 270 is mounted on both the circuit layer and the base wiring layer.

In this embodiment, the second chip 160, the first encapsulant 120 and the base wiring combination layer 110 are accommodated in the module groove 211, and the base wiring combination layer 110 is flush with the surface of the substrate 210 around the module groove 211, so that the fourth chip 270 can be used as a bridge chip to implement the electrical connection between the base wiring combination layer 110 and the substrate 210, thereby shortening the wiring path.

Twelfth Embodiment

Figure 27:
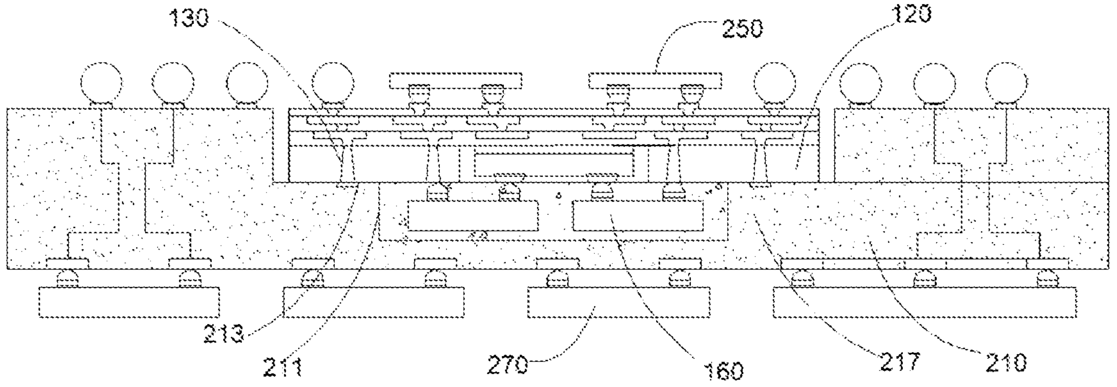
FIG. 27 is a schematic diagram of an embedded substrate chip packaging structure provided by a twelfth embodiment of the present disclosure.

Referring to FIG. 27, this embodiment provides an embedded substrate chip packaging structure 200, which includes a substrate 210 and a chip packaging module 100, wherein a circuit layer is arranged in the substrate 210, a module groove 211 is arranged on one side of the substrate 210, and the chip packaging module 100 is mounted in the module groove 211 and electrically connected with the circuit layer. Herein, the basic structure, principles and technical effects produced by the chip packaging module 100 are the same as those in the third embodiment. For brief description, please refer to the corresponding contents of the third embodiment for some points not mentioned in this embodiment.

It should be noted that for the embedded substrate chip packaging structure 200 of this embodiment, its basic structure, principles and technical effects produced are the same as those of the seventh embodiment. For brief description, please refer to the corresponding contents of the seventh embodiment for some points not mentioned in this embodiment.

Compared with the seventh embodiment, the chip packaging module 100 in this embodiment has a flip-chip structure.

In this embodiment, the second chip 160, the first encapsulant 120 and the base wiring combination layer 110 are all accommodated in the module groove 211, wherein both sides of the bottom of the module groove 211 are further provided with limiting steps 217, the first encapsulant 120 is overlapped on the limiting steps 217, the limiting steps 217 are further provided with a substrate pad 213, and the first conductive pillar 130 is connected with the substrate pad 213. A third chip 250 is mounted to the side of the base wiring combination layer 110 away from the second chip 160, and solder balls are arranged around the third chip 250, wherein the solder balls are connected with the base wiring combination layer 110 or the substrate 210. A fourth chip 270 is mounted to the side of the substrate 210 away from the third chip 250.

In this embodiment, solder balls are arranged on the base wiring combination layer 110 and the substrate 210, so that the fourth chip 270 can be directly mounted on the back of the substrate 210, thereby implementing the stacking of more chips, improving the integration level, shortening the electrical connection path of the substrate thickness in the chip packaging module 100, and improving the electrical performance.

Thirteenth Embodiment

Figure 28:
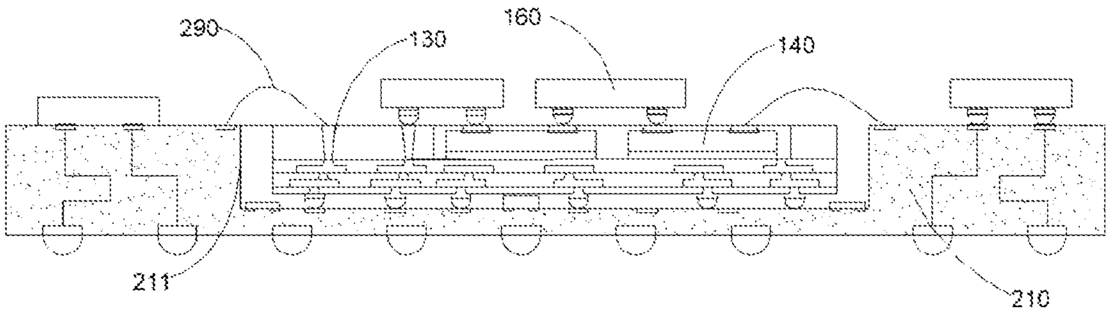
FIG. 28 is a schematic diagram of an embedded substrate chip packaging structure provided by a thirteenth embodiment of the present disclosure.

Referring to FIG. 28, this embodiment provides an embedded substrate chip packaging structure 200, which includes a substrate 210 and a chip packaging module 100, wherein a circuit layer is arranged in the substrate 210, a module groove 211 is arranged on one side of the substrate 210, and the chip packaging module 100 is mounted in the module groove 211 and electrically connected with the circuit layer. Herein, the basic structure, principles, and technical effects produced by the chip packaging module 100 and the are the same as those in the third embodiment. For brief description, please refer to the corresponding contents of the third embodiment for some points not mentioned in this embodiment.

It should be noted that for the embedded substrate chip packaging structure 200 of this embodiment, its basic structure, principles and technical effects produced are the same as those of the seventh embodiment. For brief description, please refer to the corresponding contents of the seventh embodiment for some points not mentioned in this embodiment.

Compared with the seventh embodiment, this embodiment is different in the structure and wire bonding structure of the chip packaging module 100.

In this embodiment, there are two first chips 140 and two second chips 160, wherein one of the two second chips 160 is electrically connected with the first conductive pillar 130 and the first chip 140, and the other of the two second chips 160 is electrically connected with the two first chips 140, respectively, wherein one end of the connecting wire arc 290 on one side is connected with the first conductive pillar 130, and the other end is connected with the substrate 210; and wherein one end of the connecting wire arc 290 on the other side is connected with the first chip 140, and the other end is connected with the substrate 210.

In this embodiment, the interconnection between the substrate 210 and the chip packaging module 100 is implemented by wire bonding, so that the transmission path of the wiring layer is shortened, the arrangement of too many pads is avoided, the packaging volume is reduced, and the electrical performance and integration level are improved.

Fourteenth Embodiment

Figure 29:
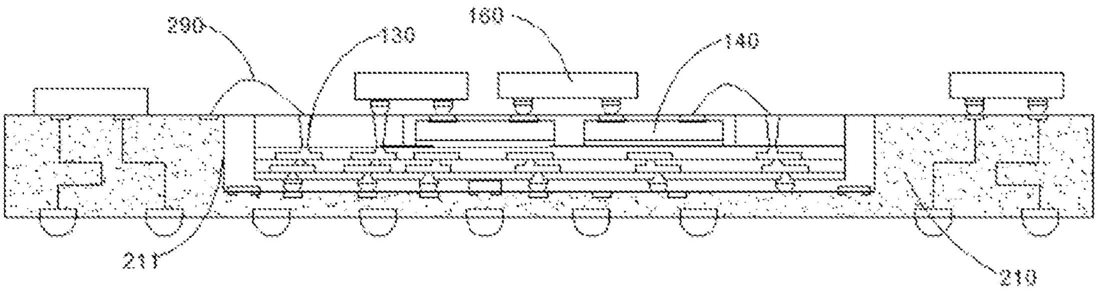
FIG. 29 is a schematic diagram of an embedded substrate chip packaging structure provided by a fourteenth embodiment of the present disclosure.

Referring to FIG. 29, this embodiment provides an embedded substrate chip packaging structure 200, which includes a substrate 210 and a chip packaging module 100, wherein a circuit layer is arranged in the substrate 210, a module groove 211 is arranged on one side of the substrate 210, and the chip packaging module 100 is mounted in the module groove 211 and electrically connected with the circuit layer. Herein, the basic structure, principles, and technical effects produced by the chip packaging module 100 are the same as those in the third embodiment. For brief description, please refer to the corresponding contents of the third embodiment for some points not mentioned in this embodiment.

It should be noted that for the embedded substrate chip packaging structure 200 of this embodiment, its basic structure, principles and technical effects produced are the same as those of the thirteenth embodiment. For brief description, please refer to the corresponding contents of the thirteenth embodiment for some points not mentioned in this embodiment.

Compared with the thirteenth embodiment, this embodiment is different in the wire bonding structure.

In this embodiment, there are two first chips 140 and two second chips 160, wherein one of the two second chips 160 is electrically connected with the first conductive pillar 130 and the first chip 140, and the other of the two second chips 160 is electrically connected with the two first chips 140, respectively, wherein one end of the connecting wire arc 290 on one side is connected with the first conductive pillar 130, and the other end is connected with the substrate 210; and wherein end of the connecting wire arc 290 on the other side is connected with the first chip 140, and the other end is connected with the adjacent first conductive pillar 130.

In this embodiment, the first chip 140 of the chip packaging module 100 is exposed, and the connection between the first conductive pillar 130 and the substrate 210 is implemented by wire bonding, so that the electrical connection function can be implemented, and the bridge can be implemented.

The beneficial technical effects of the present disclosure include, for example:

According to the chip packaging method, the chip packaging module, and the embedded substrate chip packaging structure provided by the embodiments of the disclosure, firstly, a carrier is used to form a first encapsulant on the carrier, a first conductive pillar is formed in the first encapsulant, and a bump is formed at the top of the first conductive pillar; then, the first encapsulant and the bump are etched through a micro-etching process, so that a mounting groove can be formed on the first encapsulant, and a stop ring is formed between the bump and the first conductive pillar after the bump is partially etched, then a first chip is mounted in the mounting groove, wherein the first chip has a flip-chip structure, and a second conductive pillar is arranged on the side away from the carrier, then a protective layer is formed by plastic packaging or film covering on the first encapsulant, wherein the protective layer can fill the mounting groove and wrap the bump and the first chip. Then, a grinding process is performed, and the protective layer is ground with the stop ring as a grinding stop layer to expose the stop ring and the second conductive pillar, finally, a second chip is arranged on the side of the protective layer away from the carrier, wherein the second chip can be electrically connected with both the first conductive pillar and the second conductive pillar, so as to complete chip stacking and packaging; at last, the carrier is removed, a base wiring combination layer is formed on the first encapsulant, and a single product is formed by cutting after ball planting. Compared with the prior art, in the present disclosure, the stop ring is formed by micro-etching, and the stop ring can be used as a stop layer in grinding, so that the grinding height can be determined according to its own structure, excessive grinding can be avoided during grinding, chip safety can be protected, and device reliability can be improved.

The above are only specific implementations of the present disclosure, but the scope of protection of the present disclosure is not limited to this. Changes or substitutions that any person familiar with this technical field can easily conceive within the technical scope disclosed in the present disclosure should fall within the scope of protection of the present disclosure. Therefore, the scope of protection of the present disclosure shall be subject to the scope of protection of the claims.

What is claimed is:

1. A chip packaging method, comprising steps of:

providing a carrier;

arranging a first encapsulant and a first chip on the carrier, wherein the first encapsulant is located around the first chip, a first conductive pillar is arranged in the first encapsulant, one end of the first conductive pillar penetrates to the carrier, the other end is provided with a bump protruding relative to the first encapsulant, and a second conductive pillar is arranged on one side of the first chip away from the carrier;

etching the bump to form a stop ring integrally with and between the first conductive pillar and the bump;

performing plastic packaging or film covering on the first encapsulant to form a protective layer, wherein the protective layer wraps the bump and the first chip;

performing grinding on the protective layer with the stop ring as a grinding stop layer, so as to expose the stop ring and the second conductive pillar;

arranging a second chip on one side of the protective layer away from the carrier, wherein the second chip is electrically connected with both the first conductive pillar and the second conductive pillar;

removing the carrier, and exposing the first encapsulant;

forming a base wiring combination layer on the first encapsulant; and performing ball planting on the base wiring combination layer to form solder balls, and cutting.

2. The chip packaging method according to claim 1, wherein the step of arranging the first encapsulant and the first chip on the carrier comprises:

mounting the first chip on the carrier;

performing plastic packaging on the carrier to form the first encapsulant, wherein the first encapsulant wraps the first chip; and forming the first conductive pillar in the first encapsulant.

3. The chip packaging method according to claim 1, wherein the step of arranging the second chip on one side of the protective layer away from the carrier comprises:

forming a transfer wiring combination layer on one side of the protective layer away from the carrier; and mounting the second chip on the transfer wiring combination layer.

4. The chip packaging method according to claim 1, wherein after the step of arranging the second chip on one side of the protective layer away from the carrier, the packaging method further comprises:

forming a second encapsulant outside the second chip.

5. The chip packaging method according to claim 1, wherein the step of arranging the first encapsulant and the first chip on the carrier comprises steps of:

forming the first encapsulant on the carrier;

forming the first conductive pillar in the first encapsulant;

forming a mounting groove on the first encapsulant; and mounting the first chip in the mounting groove.

6. The chip packaging method according to claim 5, wherein before the step of mounting the first chip in the mounting groove, the packaging method further comprises:

arranging a metal conductive layer on a bottom wall of the mounting groove, wherein the metal conductive layer is configured for connecting with a ground point of the base wiring combination layer.

7. The chip packaging method according to claim 5, wherein before the step of mounting the first chip in the mounting groove, the packaging method further comprises:

arranging a metal heat dissipation layer on a bottom wall of the mounting groove; and grooving on the metal heat dissipation layer to form a heat dissipation groove.

8. The chip packaging method according to claim 5, wherein before the step of mounting the first chip in the mounting groove, the packaging method further comprises:

arranging a metal heat dissipation layer on a bottom wall of the mounting groove; and etching the metal heat dissipation layer, and forming heat dissipation metal pillars at least at both ends of the metal heat dissipation layer.

9. The chip packaging method according to claim 1, wherein the step of performing grinding on the protective layer with the stop ring as a grinding stop layer comprises:

performing a first grinding on a first partition of the protective layer with the stop ring as the grinding stop layer; and performing a second grinding on a second partition of the protective layer, wherein the bump is located in the first partition, the second conductive pillar is located in the second partition, and a grinding height of the first grinding is the same as a grinding height of the second grinding.

10. The chip packaging method according to claim 9, wherein a width of the second conductive pillar gradually increases along a travel direction of grinding, so that the second conductive pillar has a frustum shape.

11. The chip packaging method according to claim 1, wherein the first encapsulant and a second encapsulant are made of polymer composite materials such as epoxy resin, silicon dioxide, calcium carbonate, or dibutyl phthalate.

* * * * *